(12) United States Patent
Moriya et al.

(10) Patent No.: US 7,556,895 B2
(45) Date of Patent: Jul. 7, 2009

(54) MASK, METHOD OF PRODUCING MASK, AND METHOD OF PRODUCING SEMICONDUCTOR DEVICE

(75) Inventors: Shigeru Moriya, Kanagawa (JP); Shinji Omori, Kanagawa (JP)

(73) Assignee: Sony Corporation (JP)

( * ) Notice: Subject to any disclaimer, the term of this patent is extended or adjusted under 35 U.S.C. 154(b) by 386 days.

(21) Appl. No.: 11/594,878

(22) Filed: Nov. 9, 2006

(65) Prior Publication Data

US 2007/0054202 A1 Mar. 8, 2007

Related U.S. Application Data

(60) Continuation of application No. 10/689,098, filed on Oct. 21, 2003, now Pat. No. 7,144,178, which is a division of application No. 10/343,701, filed on Feb. 3, 2003, now Pat. No. 6,787,785.

(51) Int. Cl.
G03F 1/00 (2006.01)
(52) U.S. Cl. .......................................................... 430/5
(58) Field of Classification Search .................. 430/5, 430/296, 394; 250/492.2, 492.22, 492.3
See application file for complete search history.

(56) References Cited

U.S. PATENT DOCUMENTS 5,874,198 A 2/1999 Okino
5,876,881 A 3/1999 Kawata
6,277,532 B1 8/2001 Yahiro

FOREIGN PATENT DOCUMENTS

| JP | 61-283121 A1 | 12/1986 |
| JP | 9-129541 A1 | 5/1997 |
| JP | 10-135103 A1 | 5/1998 |
| JP | 2000-124114 A1 | 4/2000 |
| JP | 2002-50565 A1 | 2/2002 |
| JP | 2002-222765 A1 | 8/2002 |

OTHER PUBLICATIONS

International Search Report, Sep. 2002.
International Search Report.

*Primary Examiner*—Stephen Rosasco
(74) *Attorney, Agent, or Firm*—Radar Fishman & Grauer PLLC; Ronald P. Kananen

(57) ABSTRACT

To provide a mask able to prevent a drop in pattern position accuracy due to the influence of internal stress of a membrane and able to align patterns including complementary divided patterns precisely, a method of producing the same, and a method of producing a semiconductor device. A stencil mask having lattice-shaped struts formed by etching a silicon wafer on four regions of a membrane wherein the lattices are offset from each other in the four regions and all of the struts are connected to other struts or the silicon wafer around the membrane (frame), a method of producing a stencil mask, and a method of producing a semiconductor device.

6 Claims, 26 Drawing Sheets

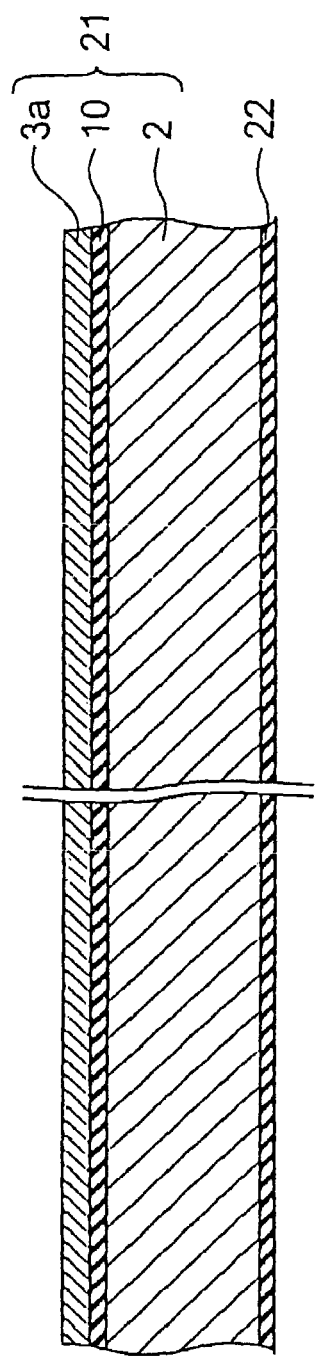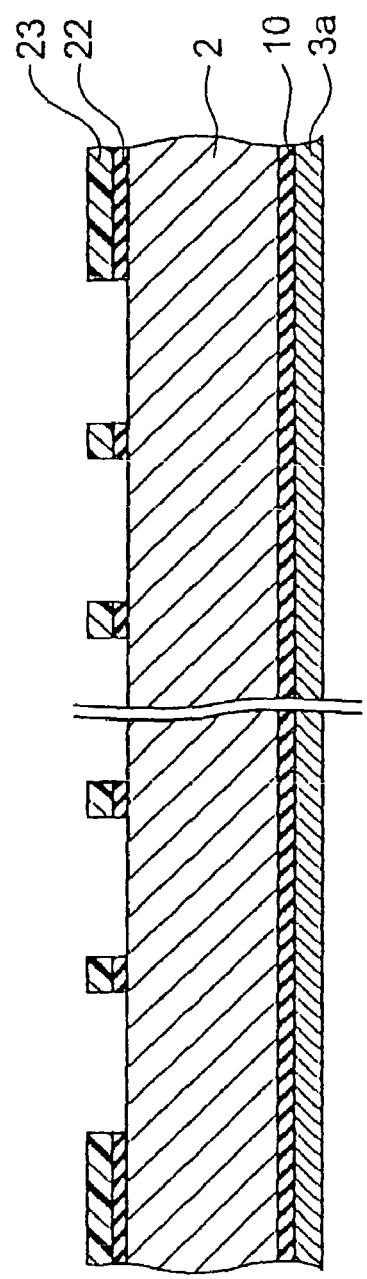
FIG. 15A
FIG. 15B

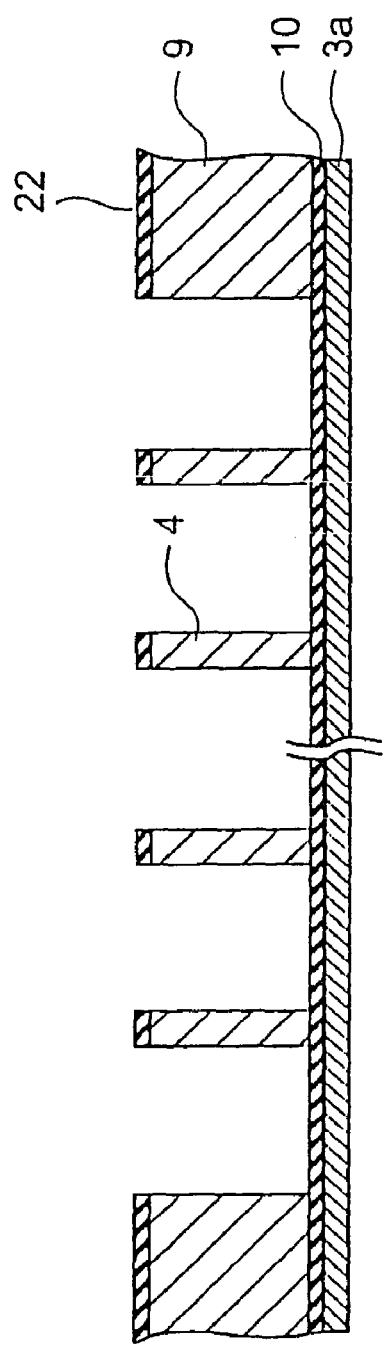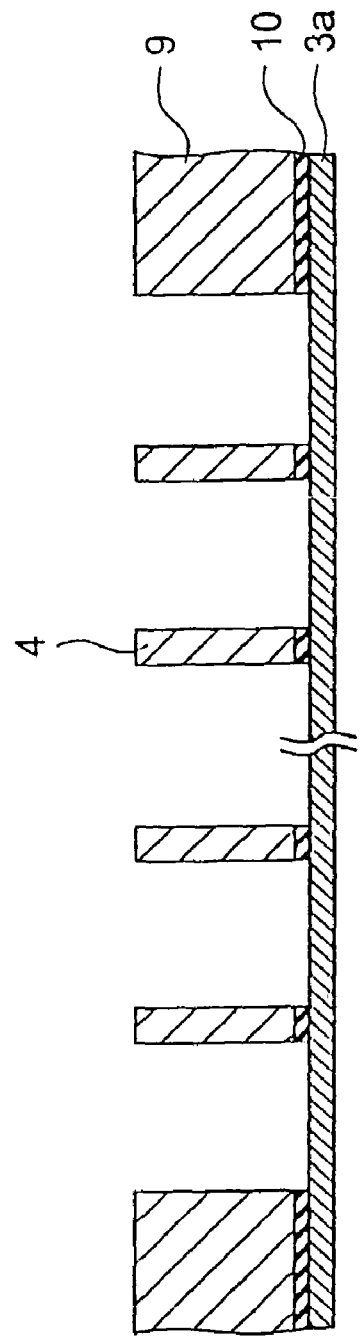

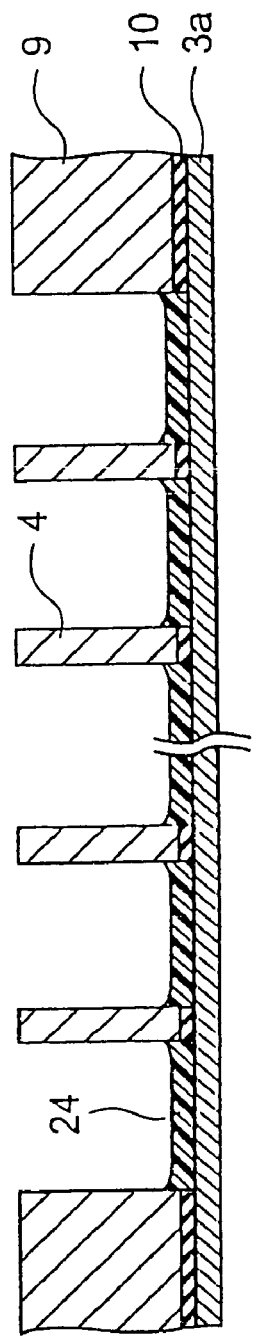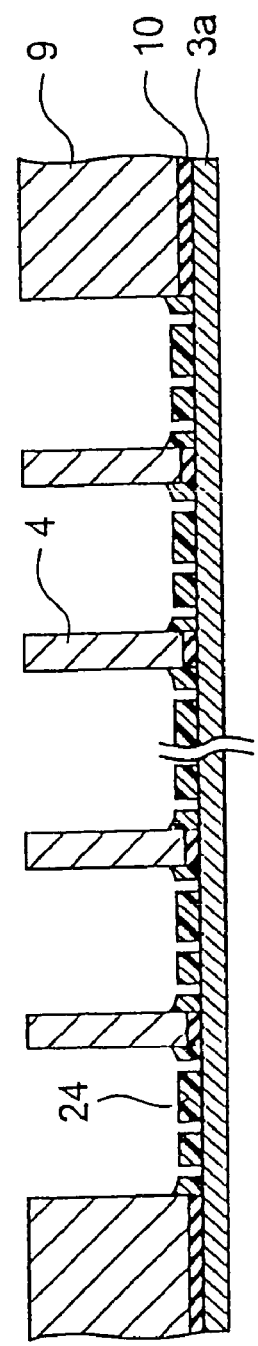
FIG. 15E
FIG. 15F

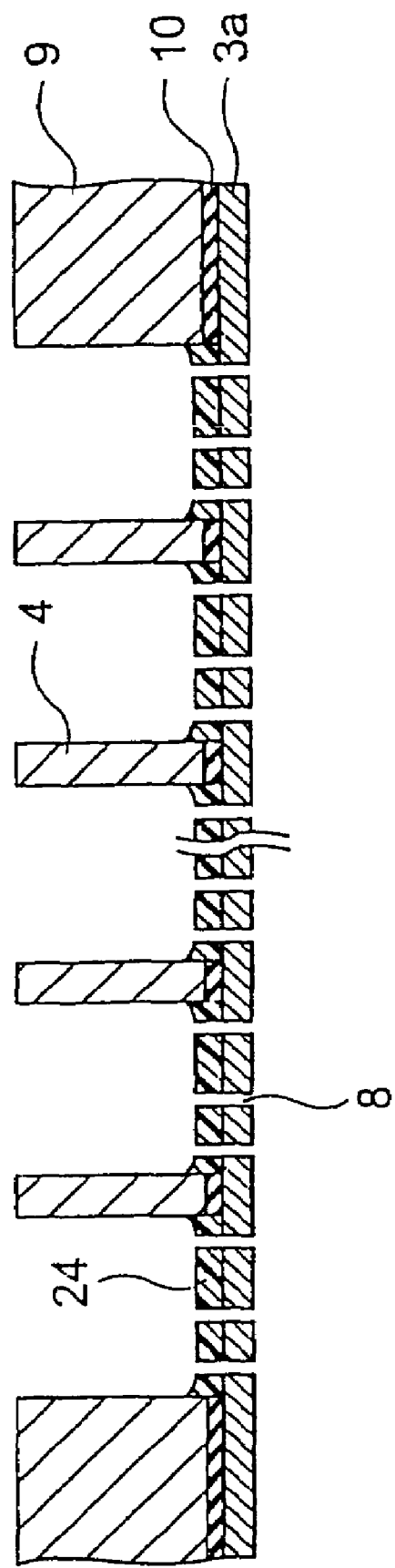

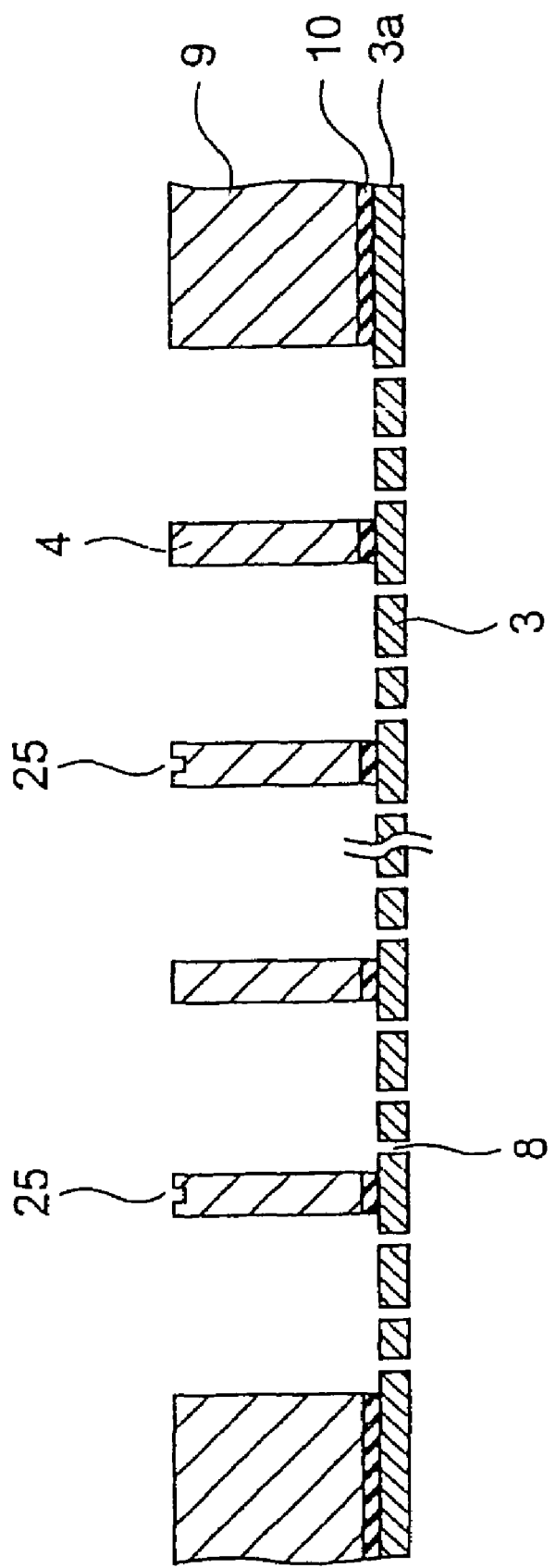

MASK, METHOD OF PRODUCING MASK, AND METHOD OF PRODUCING SEMICONDUCTOR DEVICE

This application is a continuation application of Ser. No. 10/689,098, filed Oct. 21, 2003, which is a divisional application of Ser. No. 10/343,701, filed Feb. 3, 2003, which is a national stage application of PCT/JP02/0524, filed Jun. 3, 2002, now U.S. Pat. No. 7,057,300, issued on Jun. 6, 2006.

TECHNICAL FIELD

The present invention relates to a mask used for producing a semiconductor device, a method of producing the same, and a method of producing a semiconductor device.

BACKGROUND ART

Along with miniaturization of semiconductor devices, it has become more difficult to form micropatterns by lithography utilizing ultraviolet light. Therefore, lithography technologies using X-rays, electron beams, ion beams, etc. have been proposed, researched, and developed.

As previously proposed electron beam transfer type lithography techniques, PREVAIL (projection exposure with variable axis immersion lenses) developed jointly by IBM and Nikon, SCALPEL (scattering with angular limitation in projection electron-beam lithography) developed by Lucent Technologies etc., and LEEPL (low energy electron-beam proximity projection lithography) developed jointly by LEEPL Corporation, Tokyo Seimitsu Co., Ltd., and Sony can be mentioned.

For PREVAIL and SCALPEL, a high energy electron beam of an acceleration voltage at about 100 kV is used. In the case of PREVAIL and SCALPEL, an electron beam passing through part of a mask is focused on a resist by a reduction projection system of a scale factor of usually 4 to transfer the patterns.

For LEEPL, a low energy electron beam of an acceleration voltage at about 2 kV is used (T. Utsumi, Low-Energy E-Beam Proximity Lithography (LEEPL) Is the Simplest the Best? *Jpn. J. Appl. Phys.* Vol. 38 (1999) pp. 7046-7051). In the case of LEEPL, the electron beam passes through holes provided in a mask to transfer patterns on a resist at the same scale.

LEEPL has an advantage in simplifying the configuration of the electron lens barrel compared with PREVAIL and SCALPEL. Also, generally, the higher the acceleration voltage of the electrons, the less the scattering of the electrons in the resist and the less probability of reaction of the electrons and the resist. Therefore, in lithography utilizing a high energy electron beam, a more sensitive resist is required. As opposed to this, in LEEPL, since the energy of the electron beam is low, the resist can be used at a high sensitivity and a high productivity can be realized.

FIG. 1 is a schematic view of LEEPL exposure. As shown in FIG. 1, a stencil mask 101 used for LEEPL has a thin film (membrane) 102. Holes 103 corresponding to the patterns are formed in the membrane 102. The membrane 102 is a part of a membrane formation layer 102a. The membrane formation layer 102a around the membrane 102 is formed with a support frame (frame) 104 for reinforcing the mechanical strength of the stencil mask 101.

The stencil mask 101 is arranged in proximity to the surface of a wafer 105. The wafer 105 is coated with a resist 106. When scanning the stencil mask 101 by an electron beam 107, the electron beam 107 passes through only the portions of the holes 103 so the patterns are transferred on the resist 106. Since LEEPL is same scale exposure, it was necessary in conventional LEEPL to make the size of the membrane 102 several mm to several 10 mm square or equal to the size of a LSI chip on which the patterns are transferred.

FIG. 2 is an enlarged perspective view of part of the membrane 102 of FIG. 1. As shown in FIG. 2, the membrane 102 is formed with holes 103 corresponding to the micropatterns. For etching the membrane 102 to form the holes 103 with a high precision, generally a ratio of the membrane thickness to the diameter of the holes 103 (aspect ratio) must be 10 or less, preferably 5 or less. Therefore, when forming the holes 103 for the patterns having a line width of for example 50 nm in a stencil mask for production of a device of the 0.10 μm or later generation, it is necessary to make the membrane thickness 500 nm or less.

The thinner the membrane thickness, the more precisely the holes 103 can be formed. However, a membrane 102 formed thinly easily flexes. If the membrane flexes, the transferred patterns may distort or the transferred patterns may become offset in position. Therefore, the membrane 102 is formed so that tensile stress occurs inside. The larger the area of the membrane 102, the greater the internal stress required for flattening the membrane 102.

FIG. 3 shows the change of deflection and internal stress of a membrane depending on the membrane area. Here, the membrane is made a rectangular shape with four fixed sides. The length of one side is indicated on an abscissa of FIG. 3. The deflection shows the deflection at the center of the membrane due to gravity, while the stress shows the stress occurring at the center of the membrane. FIG. 3 shows an example of calculation for a silicon nitride film having a thickness of 200 nm assuming a Young's modulus of 300 GPa.

Flattening the membrane requires an internal stress able to cancel out the stress at the center. In the example of FIG. 3, when the membrane size becomes larger than 10 mm square, the stress at the center will exceed 10 MPa. Therefore, an internal tensile stress of 10 MPa or more is required at the membrane.

Although it is possible to increase the internal stress to fabricate the membrane, if forming holes in a membrane in the state of a large internal stress, the internal stress is released at the hole parts. Therefore, as shown in for example FIG. 2, when forming a plurality of holes of different shapes from each other unevenly in the membrane or forming holes having large diameters, offset or distortion of the patterns easily occurs around the holes.

Separate from the above problems, in the case of a stencil mask, there is the restriction that formation of specific patterns requires use of a complementary mask. A membrane mask comprised, without holes, of a substrate formed with a light-blocking film (or bodies for scattering a charged particle beam) may be formed topologically with donut-shaped interconnection patterns without problem. As opposed to this, in the case of a stencil mask, since all of the parts except the holes must be connected, when forming donut-shaped interconnection patterns, it is necessary to divide the patterns among a plurality of masks and to perform multiple exposure using these masks.

Alternatively, when forming holes corresponding to long line-shaped patterns, anisotropic distortion occurs in the pattern shapes due to the influence of the internal stress so the line width will not become even or stress will concentrate at corners of the patterns and the membrane will easily break. Therefore, long line-shaped patterns are also sometimes divided into a plurality of rectangles and continuous patterns are transferred by multiple exposure.

In the above way, when using a stencil mask for electron beam transfer type lithography, multiple exposure using a plurality of masks is assumed and the patterns have to be aligned with a high accuracy.

Further, in recent semiconductor devices, the number of interconnection layers forming the multilayer interconnections has been increasing. Securing alignment accuracy of the patterns between layers has been becoming increasingly difficult.

DISCLOSURE OF THE INVENTION

The present invention was made in consideration of the above problems and has as its object to provide a mask able to prevent a drop in pattern alignment accuracy due to the internal stress of the membrane and able to align patterns including complementary patterns at a high accuracy, a method of producing the same, and a method of producing a semiconductor device.

To achieve the above object, the mask of the present invention is characterized by comprising a support frame; a thin film formed thinner than the support frame and surrounded by the support frame; a first section comprised of one of four sections consisting of regions obtained by dividing the thin film into four by a first straight line passing through a first point consisting of one point on the thin film and extending in a first direction and a second straight line orthogonal to the first straight line at the first point and extending in a second direction; a second section adjacent to the first section in the first direction; a third section adjacent to the second section in the second direction; a fourth section adjacent to the third section in the first direction and adjacent to the first section in the second direction; a first group of struts, in each of the first to fourth sections, comprised of a plurality of struts formed from the same material as the support frame, extending in the first direction, and formed in parallel with each other at equal intervals so as to connect with the support frame on the thin film; a second group of struts, in each of the first to fourth sections, comprised of a plurality of struts formed from the same material as the support frame, extending in the second direction, and formed in parallel with each other at equal intervals so as to connect with the support frame on the thin film and intersect the first group of struts; skirts provided in parallel to the struts at the thin film at the two side parts of the struts; strut zones comprised of the struts and the skirts at the two sides where the interval between adjacent strut zones becomes a whole multiple of at least 3 of the width of the strut zones, a first strut zone including one of the first group of struts formed in the first section and contacting the first straight line, the first strut zone being connected to the second group of struts of the fourth section at different locations from the second group of struts of the first section in the first direction, a second strut zone including one of the second group of struts formed in the first section and contacting the second straight line, the second strut zone being connected to the first group of struts of the second section at different locations from the first group of struts of the first section in the second direction, a third strut zone including one of the first group of struts formed in the third section and contacting the first straight line, the third strut zone being connected to the second group of struts of the second section at different locations from the second group of struts of the third section in the first direction, a fourth strut zone including one of the second group of struts formed in the third section and contacting the second straight line, the fourth strut zone being connected to the first group of struts of the fourth section at different locations from the first group of struts of the third section in the second direction; holes provided in the part of the thin film surrounded by the strut zones and passed through by a charged particle beam, the holes being formed by complementary divided patterns comprised of different parts of the same patterns in the first to fourth sections; and four superpositioned regions of the same shapes and sizes selected from the first to fourth sections, the superpositioned regions including the first and second straight lines, wherein any point on the superpositioned regions is included in the thin film other than the strut zones in at least two sections of the first to four sections.

The holes may be formed at least at parts of the skirts. Preferably, a plurality of alignment marks are provided at parts of the surfaces of the struts where the charged particle beam enters. The thin film may be an electroconductive layer. Alternatively, it is possible to provide an electroconductive layer formed on the thin film other than the hole parts.

To achieve the above object, the method of producing a semiconductor device of the present invention includes the step of irradiating a charged particle beam via a mask formed with predetermined mask patterns to transfer the mask patterns on the photosensitive surface and comprises using a mask of the present invention as the mask for multiple exposure of the complementary divided patterns formed in the first to fourth sections.

To achieve the above object, the mask of the present invention includes at least three masks, each mask comprising a support frame; a thin film formed thinner than the support frame and surrounded by the support frame, the thin film having the same shape and size among all of the masks; a plurality of blocks obtained by dividing the thin film into regions; a group of selected blocks composed of selected blocks selected from the plurality of blocks, the selected blocks being connected to at least two other selected blocks or connected to at least one other selected block and the support frame; holes formed in the thin film of non-selected blocks and passed through by a charged particle beam, in each mark, the holes formed in complementary divided patterns forming different parts of the same pattern; and struts formed on the thin film of the group of selected blocks, the struts connected to the support frame; all of the blocks becoming non-selected blocks in at least two of the masks.

The struts may be formed on a surface of the thin film at a side where the charged particle beam enters or the surface of the opposite side. Preferably, provision is made of a plurality of alignment marks at parts of the struts. The thin film may also be an electroconductive layer. Further, it is also possible to form an electroconductive layer on the thin film other than the hole parts. Preferably, the blocks are arranged in a lattice.

The method of producing a mask of the present invention is characterized by comprising the steps of forming a thin film on one surface of a substrate; forming struts on the thin film at predetermined intervals; removing a center of the thin film from the other surface of the substrate to expose the thin film and form a support frame comprised of the substrate; and forming holes through which a charged particle beam passes in part of the thin film surrounded by the struts.

Alternatively, it comprises the steps of forming a sacrifice film on one surface of a substrate; forming struts on the sacrifice film at predetermined intervals; removing a center part of the substrate from the other surface of the substrate to expose the sacrifice film and form a support frame comprised of the substrate; forming a thin film on a surface of the sacrifice film at the opposite side of the struts; forming holes through which a charged particle beam passes at parts of the thin film surrounded by the struts; and removing the parts of the sacrifice film not contacting the support frame.

The method of producing a semiconductor device of the present invention is characterized by including the step of irradiating a charged particle beam on a photosensitive surface via a mask on which complementary divided patterns forming parts of predetermined patterns are formed to transfer the complementary divided patterns on the photosensitive surface and the step of multiply exposing the photosensitive surface by the charged particle beam through masks on which other complementary divided patterns of the patterns are formed to transfer the patterns complementarily, characterized by using a complementary mask of the present invention comprised of at least three masks for the multiple exposure.

Due to this, it is possible to lower a tensile internal stress of the thin film as required for preventing deflection of the thin film. Therefore, displacement or distortion of holes due to release of the internal stress when forming the holes in the thin film is lowered. Further, mechanical strength of the thin film is reinforced. Further, it becomes possible to align precisely the entire membrane by providing alignment marks on the struts.

BRIEF DESCRIPTION OF THE DRAWINGS

FIGS. 15A to 15G are cross-sectional views of production steps of a method of producing a stencil mask according to the first embodiment of the present invention.

FIG. 16 is a cross-sectional view of a stencil mask according to the first embodiment of the present invention.

BEST MODE FOR CARRYING OUT THE INVENTION

Below, a preferred embodiment of a mask, a method of producing a mask, and a method of producing a semiconductor device of the present invention will be described with reference to the accompanying drawings.

First Embodiment

Figure 4:
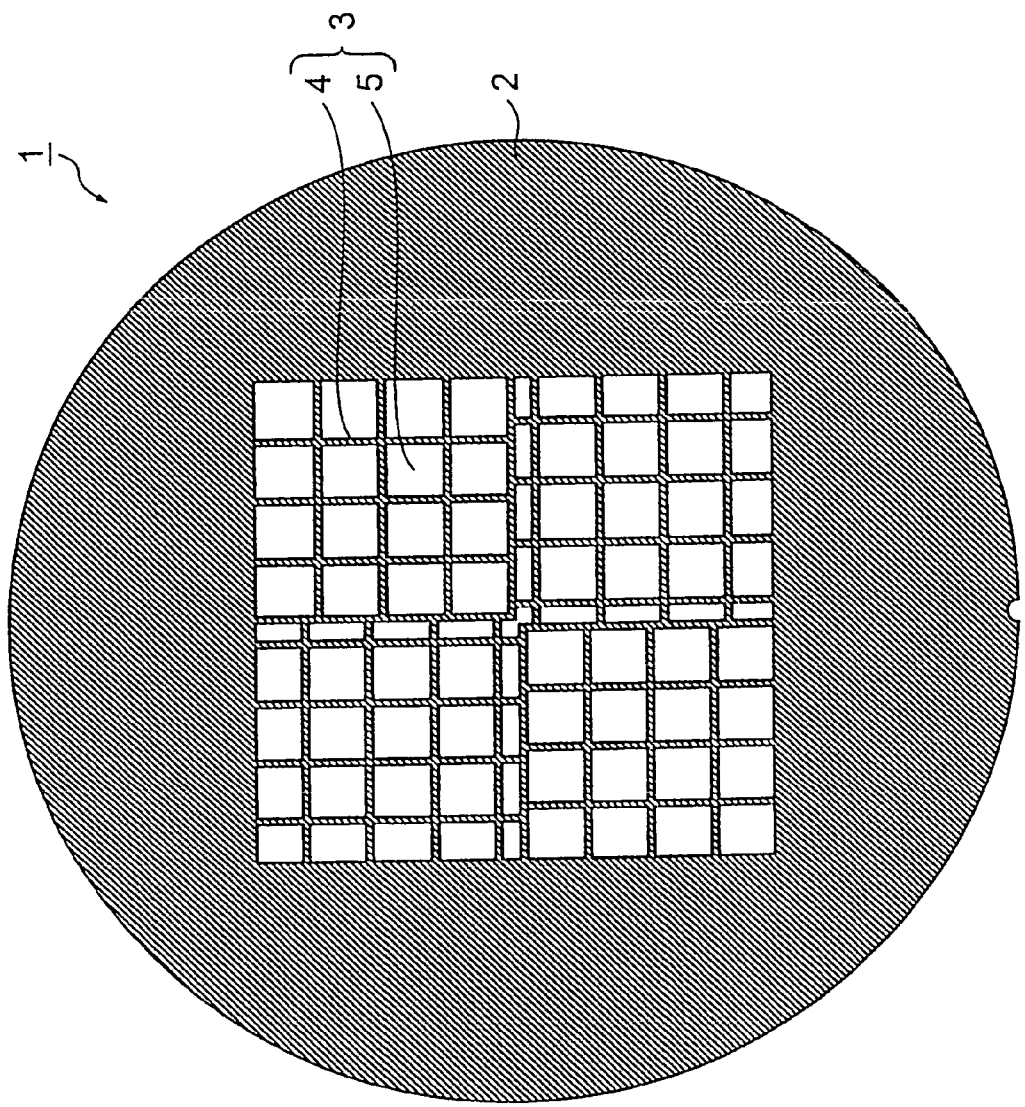
FIG. 4 is a plane view of a stencil mask according to a first embodiment of the present invention.

A stencil mask of the present embodiment is suitably used for LEEPL. FIG. 4 is a schematic plane view of the stencil mask 1 of the present embodiment.

As shown in FIG. 4, the stencil mask 1 is formed from a silicon wafer 2. A center part of the silicon wafer 2 is removed in a square shape. This portion is formed with a membrane 3. The thick silicon wafer 2 around the membrane 3 is used as a support frame (frame) for supporting the membrane 3. The membrane 3 is formed with lattice-like struts 4. The struts 4 are the parts remaining after forming a plurality of openings in the silicon wafer 2. The ends of all of the struts 4 are connected to the frame or other struts 4. There are no places where the struts 4 are broken midway.

Below, the square parts of the membrane 3 surrounded by the struts 4 will be referred to as "membrane divided regions 5". Both sides of the struts 4 of the membrane 3 are provided with skirts of a very narrow width parallel to the strut 4. The parts of the membrane divided regions 5 other than the skirts will be referred to as "pattern regions". Further, the parts combining the struts 4 and skirts will be referred to as "strut zones".

Figure 5:
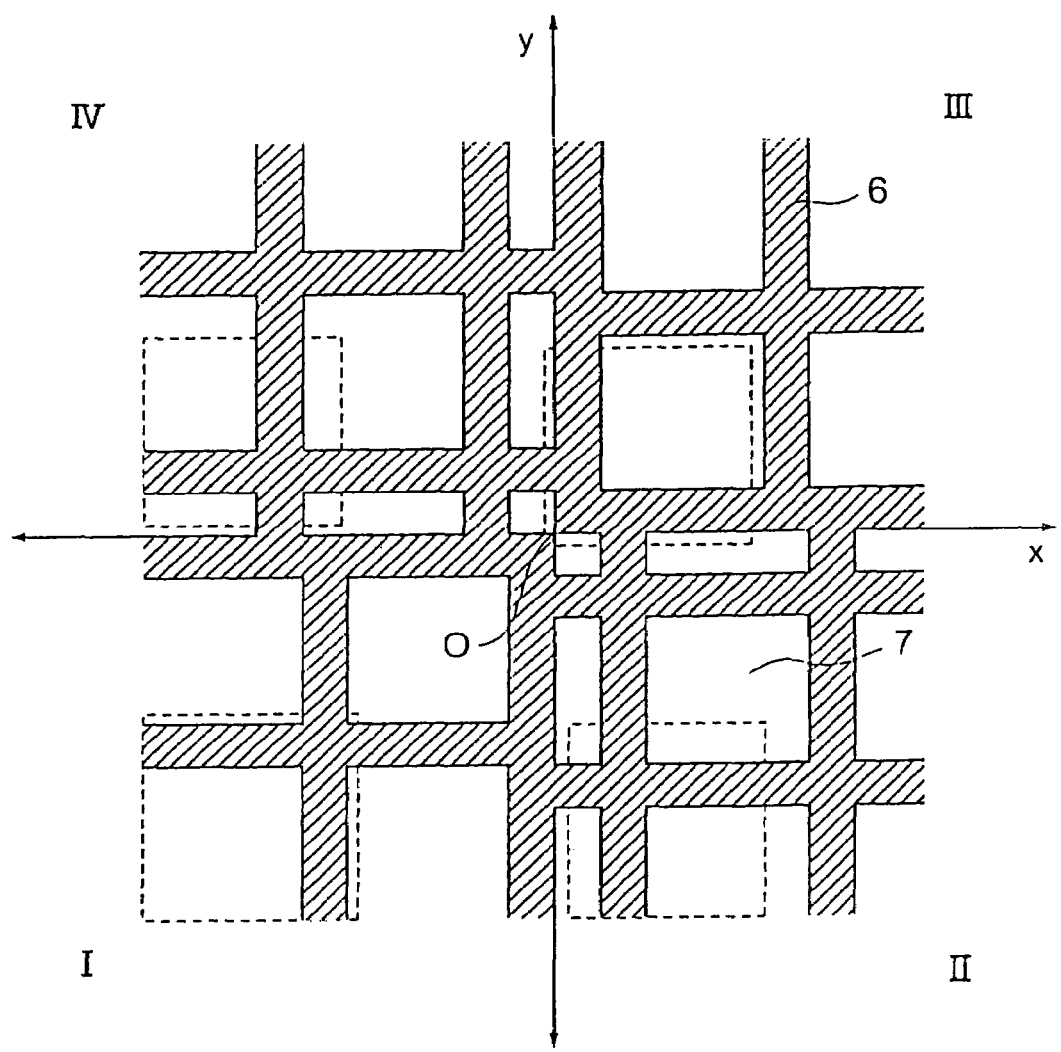
FIG. 5 is an enlarged view of a membrane 3 of FIG. 4.

Next, the arrangement of the struts 4 at the stencil mask 1 of FIG. 4 will be explained. FIG. 5 is an enlarged view of the center part of the membrane 3 of FIG. 4. The strut zones 6 are shown in place of the struts 4 of FIG. 4. The square parts surrounded by the strut zones 6 are the pattern regions 7.

When assuming the center of the silicon wafer 2 of FIG. 4 as the origin O and the membrane 3 of FIG. 5 as a X-Y plane, the membrane 3 is divided into four regions by an x-axis and y-axis. Below, these regions will be referred to as the "sections I to IV".

The membrane 3 does not strictly have to be a square. So long as the sections I to IV are rectangular shapes or shapes close to them having the x-axis and y-axis as two sides, the lengths of all sides of the sections I to IV do not have to completely match.

Sections I to IV have a plurality of strut zones 6 arranged in them in parallel to the x-axis at equal intervals from each other. In the same manner, sections I to IV have a plurality of strut zones 6 arranged in parallel to the y-axis at equal intervals from each other. These strut zones 6 are formed with the struts 4 of FIG. 4 inside them.

The positions of the strut zones 6 parallel to the x-axis do not match between the section I and section II or section III and section IV adjoining each other in the x-axis direction. In the same manner, the positions of the strut zones 6 parallel to the y-axis do not match between the section I and section IV or section III and section III adjoining each other in the y-axis direction.

In the four sections I to IV, only one pair of sections located on a diagonal of the membrane 3 have the strut zones 6 contacting both the x-axis and y-axis. In the example shown in FIG. 5, in the four sections I to IV, the section I has the strut zone 6 arranged at the boundary part with the section IV (part contacting the x-axis) and the strut zone 6 arranged at the boundary part with the section II (part contacting the y-axis).

The section III on the diagonal with the section I has the strut zone 6 arranged at the boundary part with the section II (part contacting the x-axis) and the strut zone 6 arranged at the boundary part with the section IV (part contacting the y-axis).

Alternatively, it is also possible to arrange the other pair of sections located on a diagonal line, that is, the section II and section IV of FIG. 5 so that the strut zones 6 contact to both x-axis and y-axis.

In the example shown in FIG. 5, in the section II and section IV, the strut zones 6 are not formed along the boundaries with the adjacent sections. The ends of the strut zones 6 of the section II and the section IV connect to the strut zones 6 of the adjacent sections in T-shapes. The strut zones 6 of the section II and the section IV are arranged so as to fulfill certain conditions. The conditions of arrangement will be explained later.

The length of one side of the interval between the strut zones 6, that is, a pattern region 7, is made a whole multiple of 3 or more when the width of the strut zone 6 is set as 1. The interval between the strut zones 6 will also be explained later in detail.

Figure 6:
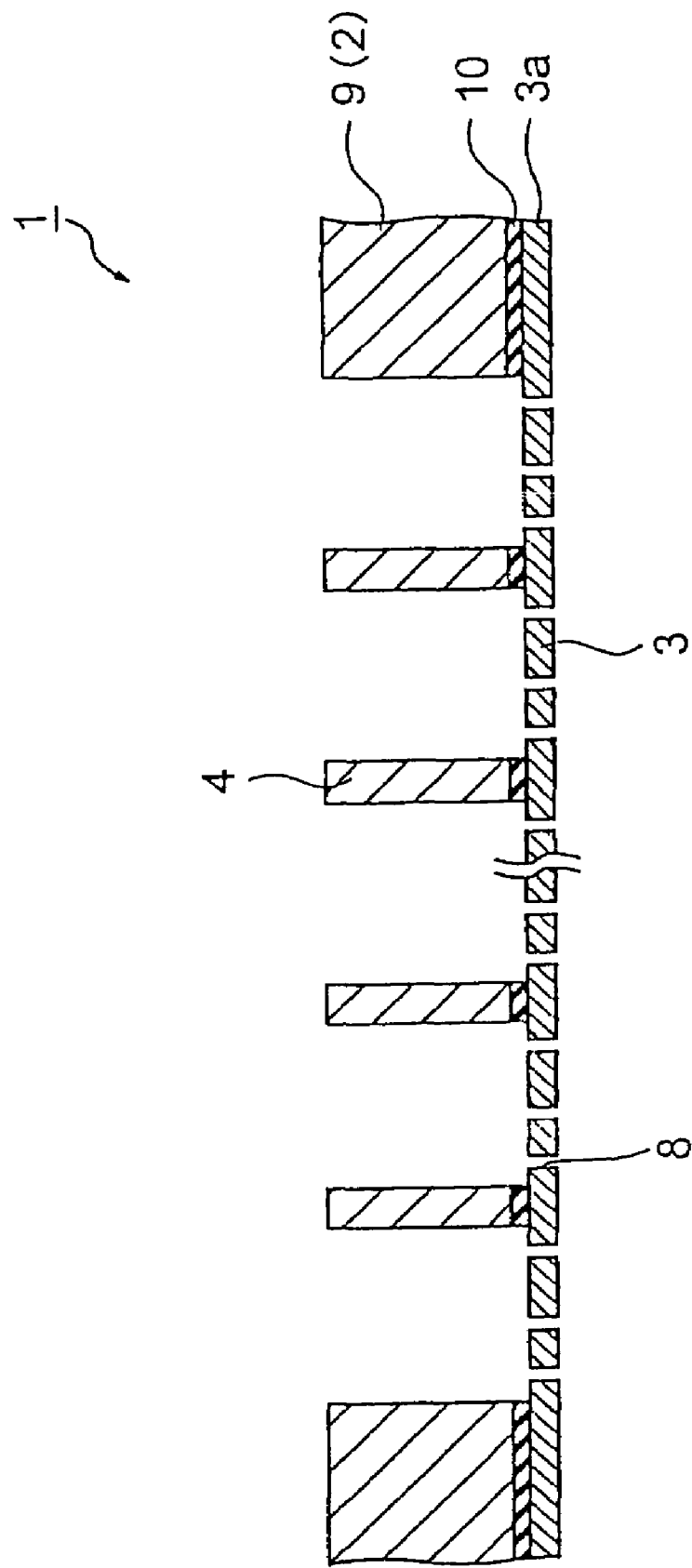
FIG. 6 is a cross-sectional view of the stencil mask of FIG. 4.

FIG. 6 is a cross-sectional view of the stencil mask 1 of FIG. 4. As shown in FIG. 6, the membrane 3 of the stencil mask 1 is formed with holes 8 corresponding to the patterns. The membrane 3 is a part of a membrane formation layer 3a. The silicon wafer 2 around the membrane 3 is a frame 9 for supporting the membrane 3. The membrane 3 is formed with struts 4 at certain intervals at the surface on the frame 9 side. Note that a silicon oxide film 10 is used as an etching stopper layer at production steps of the stencil mask 1.

The stencil mask 1 is arranged so that the surface on the membrane 3 side is proximate to the surface of the wafer to which the patterns are transferred. When scanning the stencil mask 1 from the frame 9 side by an electron beam, the electron beam passes through only the parts of the holes 8 whereby the patterns are transferred on the resist on the wafer.

Figure 1:
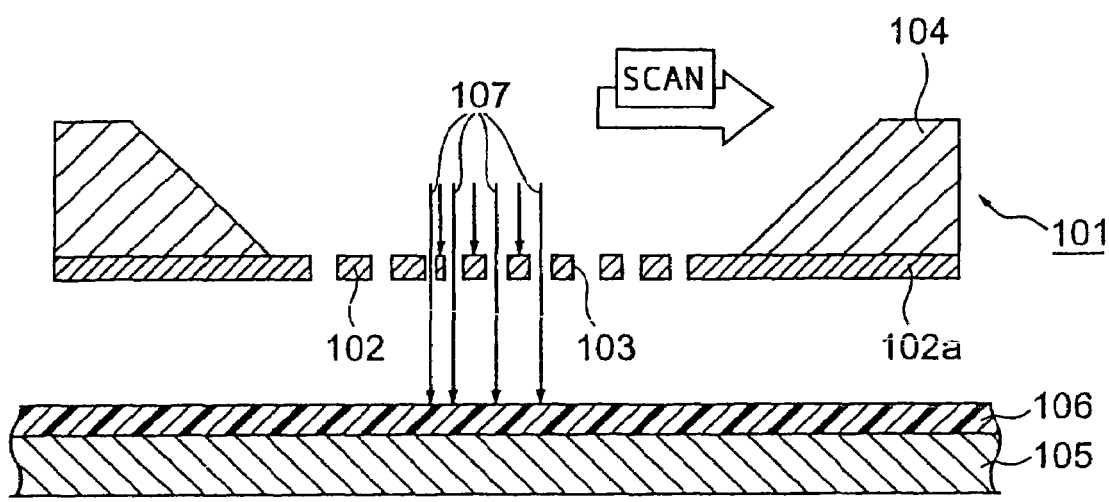
FIG. 1 is a schematic view of LEEPL exposure.
Figure 2:
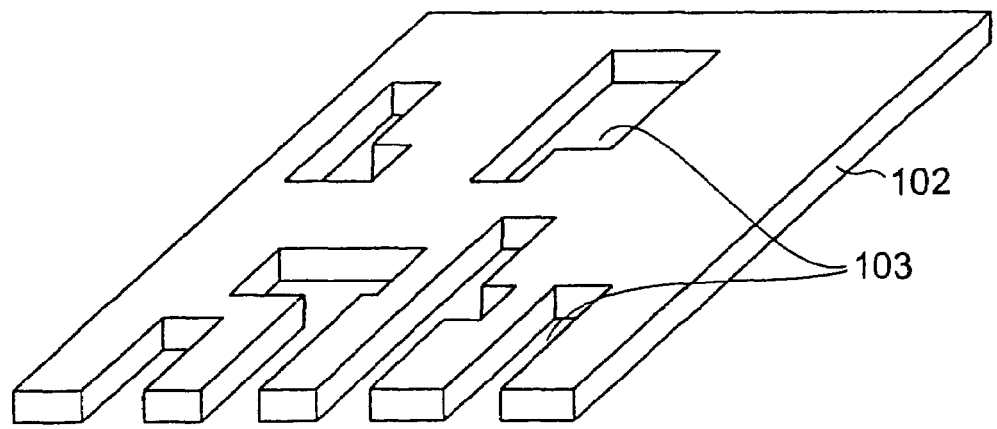
FIG. 2 is a perspective view of part of a stencil mask.

Unlike the conventional LEEPL exposure stencil mask shown in FIG. 1, the stencil mask 1 of the present embodiment cannot be formed with holes 8 at the strut 4 parts. Therefore, the patterns are divided to complementarily form them in the sections I to IV of FIG. 5.

When using the stencil mask 1 for exposure, first, the stencil mask 1 and wafer are fixed and the patterns of the sections I to IV of FIG. 5 are transferred. Next, the stencil mask 1 and wafer are moved relatively to arrange different sections of the stencil mask 1 on the transferred patterns of the sections I to IV. Usually, it is easier to move the wafer while the stencil mask 1 is fixed.

After moving the wafer, the stencil mask 1 is again scanned by the electron beam. The above steps are repeated and exposure performed multiply four times so that the patterns of the four sections I to IV of the stencil mask 1 (see FIG. 5) overlap. Due to this, the patterns located at the strut 4 parts are also transferred to the resist complementarily.

Figure 7:
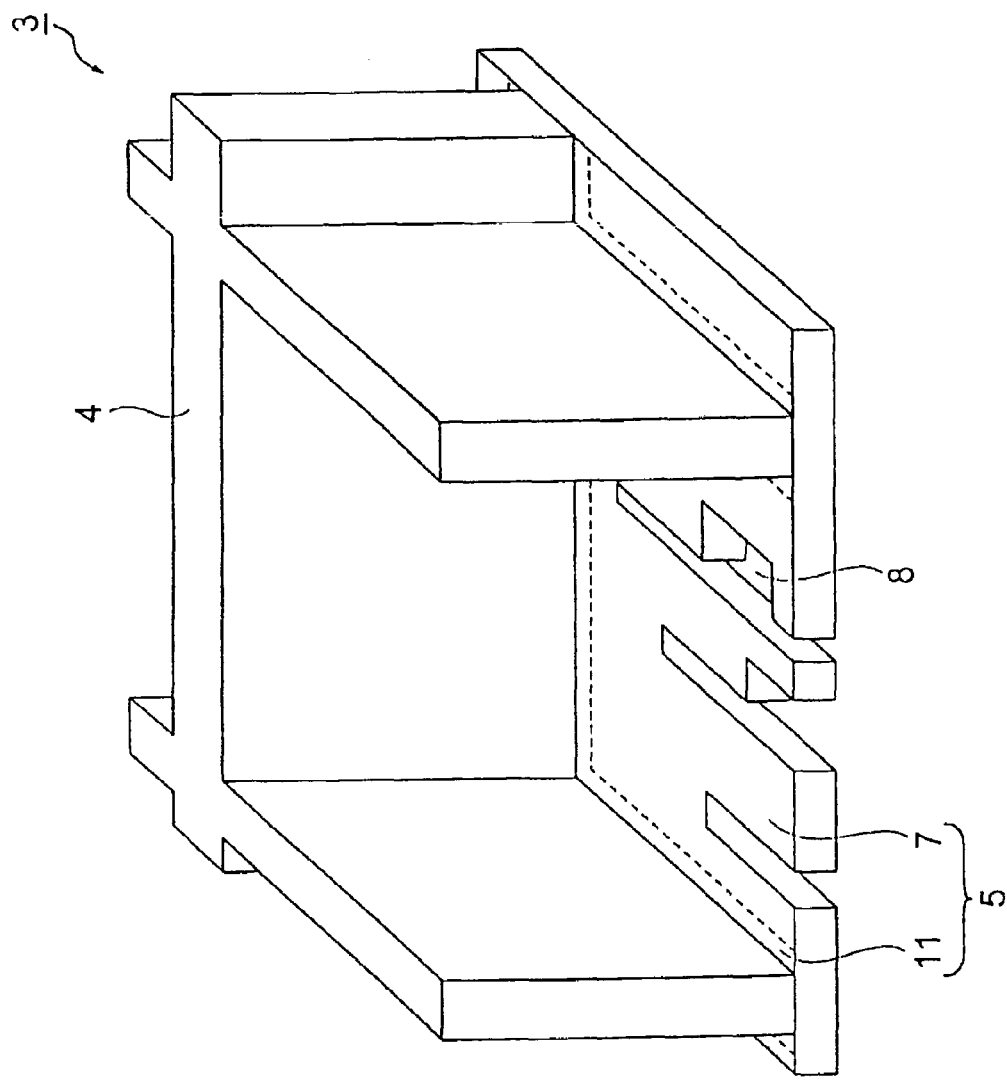
FIG. 7 is an enlarged perspective view of one membrane divided region 5 and struts 4 around it of FIG. 4.

FIG. 7 is an enlarged perspective view of one of the membrane divided regions 5 and the struts 4 around it. As shown in FIG. 7, the membrane 3 is divided into the membrane divided regions 5 by the struts 4. The holes 8 corresponding to the patterns cannot be formed at the strut 4 parts and are formed at the parts of a membrane divided region 5 of the membrane 3. The part surrounded by the broken line in the membrane divided region 5 corresponds to the pattern region 7 of FIG. 5.

The part outside of the pattern region 7 in the membrane divided region 5 is the skirt 11. The parts combining the struts 4 and the skirts 11 at the two sides of the struts 4 correspond to the strut zones 6 of FIG. 5. In principle, the holes 8 are formed in the pattern region 7, but in some cases they may be formed protruding out to parts of the skirts 11.

Figure 8:
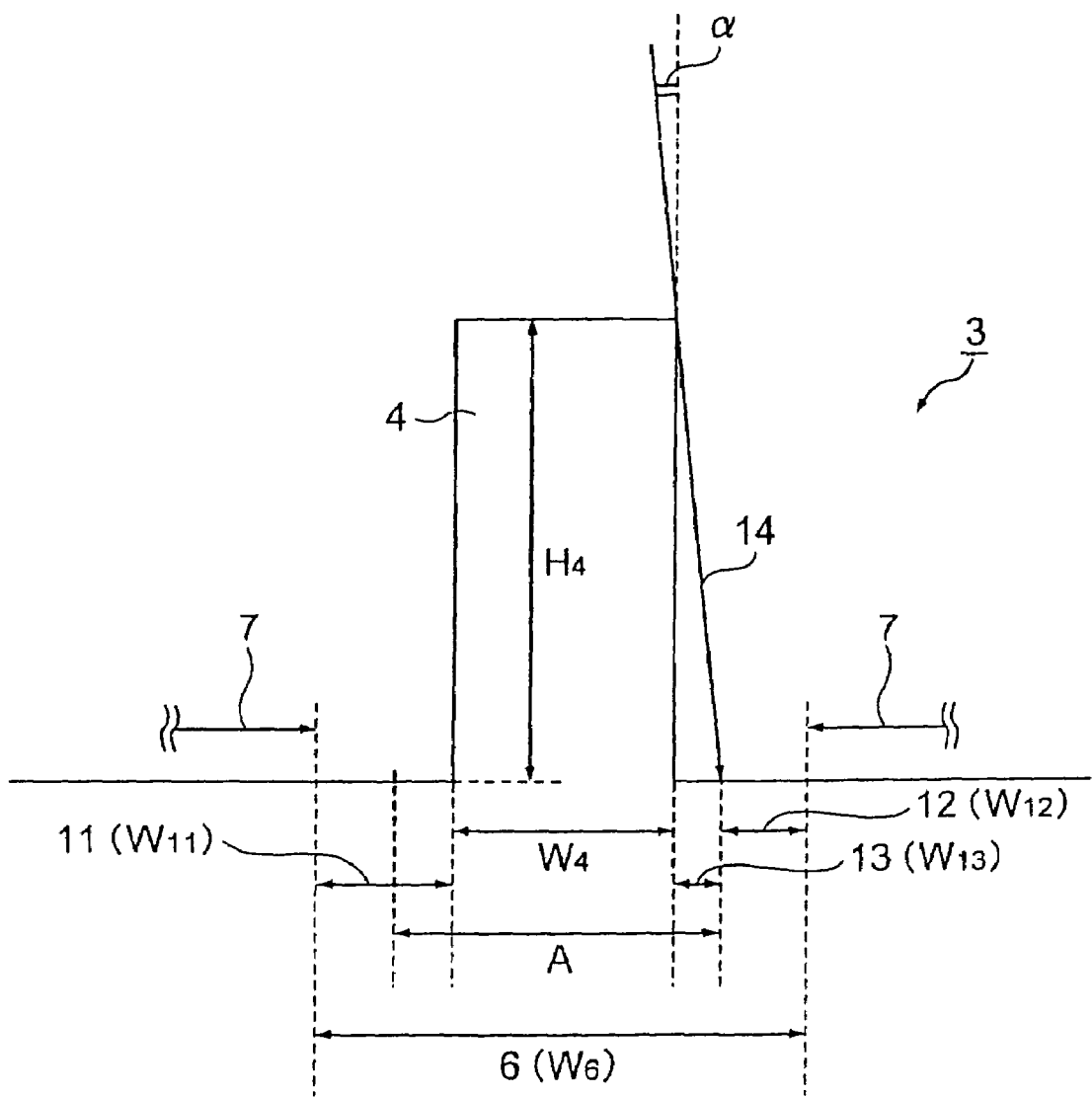
FIG. 8 is an enlarged cross-sectional view of the struts 4 of FIG. 4.

FIG. 8 is an enlarged sectional view of the vicinity of a strut 4 of FIG. 7. As shown in FIG. 8, the combined width of the width $W_4$ of the strut 4 and the widths $W_{11}$ of the skirts 11 at the two sides is the width $W_6$ of the strut zone 6. The width $W_4$ of the strut 4 can be set for example to about 100 to 200 μm. Each skirt 11 is further divided into a margin 12 and blank 13. The margin 12 is at the pattern region 7 side, while the blank 13 is at the strut 4 side.

Below, the margin 12 and blank 13 will be explained. When a pattern will not fit in the pattern region 7, in principle, holes 8 corresponding to the patterns of protruding part are formed in another section of the four sections I to IV (see FIG. 5) of the stencil mask and the patterns are stitched together by multiple exposure.

However, when the patterns protrude very slightly from the pattern region 7, it would be more advantageous to be able to transfer the pattern without division rather than forming complementary patterns at any other of the sections I to IV and stitching them together. Particularly, when narrow line width micropatterns, for example, gates, protrude out slightly from the pattern region 7, if dividing them into complementary patterns, there is a high possibility of causing a drop in the properties of the semiconductor device produced.

Consequently, the pattern region 7 is provided around it with a margin 12 enabling formation of holes 8. The width $W_{12}$ of the margin 12 can be freely set, but if increasing $W_{12}$, the original region for the pattern, that is, the pattern region 7, will become smaller. Therefore, $W_{12}$ is set at for example to about several μm to several tens of μm.

According to LEEPL, the incident angle of the electron beam to the stencil mask can be finely changed. The range of the incident angle of the electron beam is usually 0 to about 10 mrad. When using an 8-inch wafer to form a stencil mask, the height $H_4$ of the strut 4 becomes the 725 μm of the thickness thickness of the 8-inch wafer.

As shown in FIG. 8, when the electron beam 14 strikes the membrane 3 obliquely, a region is formed near the strut 4 where the electron beam 14 will not strike. If the incident angle α of the electron beam 14 is made a maximum 10 mrad, the minimum required width $W_{13}$ of the blank 13 is calculated as:

$$W_{13} = 10 \times 10^{-3} \text{ (rad)} \times H \text{ (μm)} = 7.25 \text{ (μm)} \approx 7 \text{ (μm)}$$

As explained above, the part A combining a strut 4 and the blanks 13 at the two sides of the strut 4 are not formed with holes 8.

Next, the method of dividing the complementary patterns in the sections I to IV of. FIG. 5 in the above-explained stencil mask of the present embodiment will be explained in detail. When dividing the patterns, processing can be performed more simply when dealing with the width $W_6$ of the strut zones 6 than the actual width $W_4$ of the struts 4 shown in FIG. 8.

Figure 9:
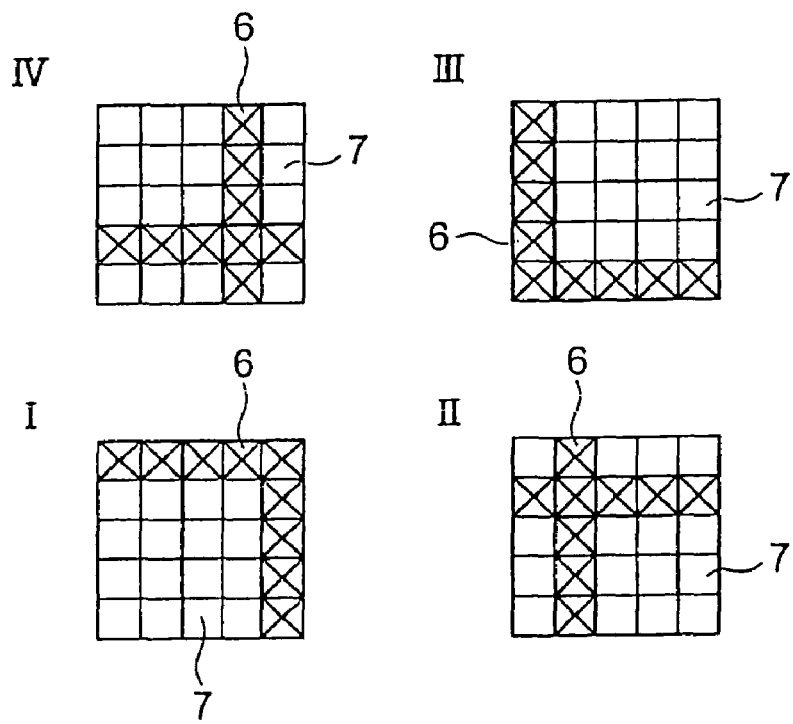
FIG. 9 is an example of patterns showing the arrangement of strut zones 6 of a stencil mask according to the first embodiment of the present invention.

FIG. 9 extracts the smallest unit of patterns for multiple exposure (patterns in region surrounded by a broken line of FIG. 5) in the sections I to IV of FIG. 5 and shows them supplementarily with grids. The blank blocks in the sections I to IV indicate pattern regions 7, while the X'ed blocks indicate the strut zones 6. FIG. 9 shows a case where the ratio of the width $W_6$ of the strut zones 6 (see FIG. 8) to the length of a side of the pattern region 7 is 1:4.

The following TABLE 1 arranges the 5×5 block patterns of FIG. 9 in a 5 row×5 column table and shows in which sections patterns can be formed.

TABLE 1

|   | II | IV |   | III | IV |   | II | III | IV |   | II | III |   | II | III | IV |
|---|----|----|---|-----|----|---|----|-----|----|---|----|-----|---|----|-----|----|
| I |    | IV | I | III | IV | I |    | III | IV | I |    | III |   |    | III | IV |
| I | II | IV | I | III | IV | I | II | III | IV | I | II | III | II | III | IV |
| I | II |    | I | III |    | I | II | III |    | I | II | III | II | III |    |
| I | II | IV | I |     | IV | I | II |     | IV | I | II |     |    | II  | IV |

As shown in TABLE 1, for all of the blocks, it is possible to form patterns in at least two sections of the sections I to IV. Therefore, even if there are topologically donut-shaped patterns, it is possible to transfer the patterns by dividing the patterns and forming holes in two sections to be exposed multiply.

As explained with reference to FIG. 5, the strut zones 6 can be determined unambiguously for the sections I and III of FIGS. 5 and 9. On the other hand, arrangements other than that shown in FIG. 9 are also possible for the sections II and IV.

Figure 10:
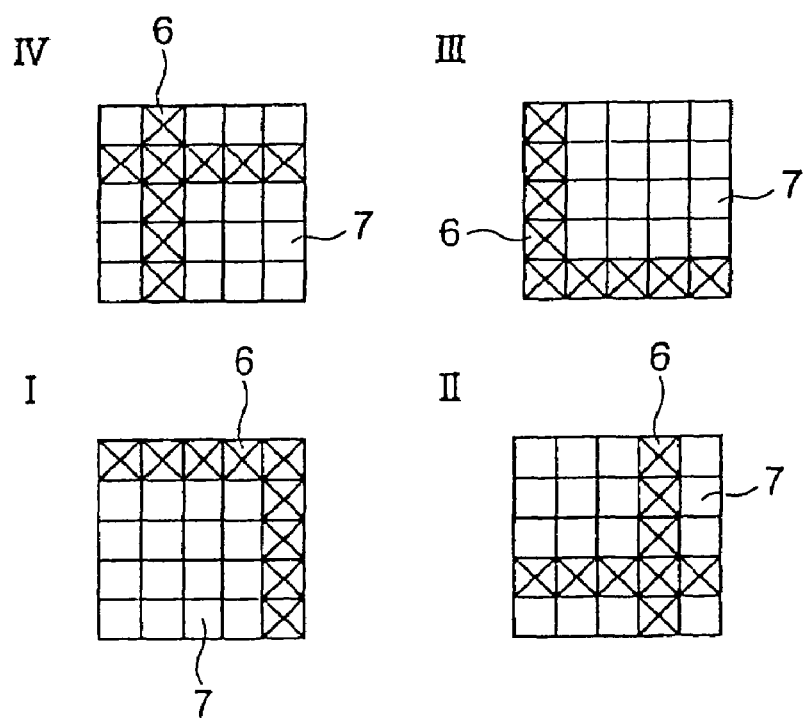
FIG. 10 is another example of patterns showing the arrangement of strut zones 6 of a stencil mask according to the first embodiment of the present invention.

FIG. 10 shows an example of moving the strut zones 6 of the sections II and IV. The following TABLE 2 summarizes which sections the patterns can be formed in in the same way as TABLE 1 for the blocks of FIG. 10.

TABLE 2

|   | II | IV |   | II | III |   | II | III | IV |   | III | IV |   | II | III | IV |
|---|----|----|---|----|-----|---|----|-----|----|---|-----|----|---|----|-----|----|
| I | II |    | I | II | III | I | II | III |    | I | III |    |   | II | III |    |
| I | II | IV | I | II | III | I | II | III | IV | I | III | IV | II | III | IV |
| I |    | IV | I |    | III | I |    | III | IV | I | III | IV |   |    | III | IV |
| I | II | IV | I | II |     | I | II |     | IV | I |     | IV |   | II |     | IV |

In the example of FIG. 10 too, for all of the blocks, it is possible to form patterns in at least two sections of the sections I to IV. Therefore, the strut zones 6 can also be arranged as patterns shown in FIG. 10. However, in FIG. 9, the distance between struts becomes shorter at the center of the membrane (near the origin of FIG. 5) and between adjoining sections of the four sections I to IV (on the x-axis and y-axis of FIG. 5), but in the example of FIG. 10, the distance between struts is longer than in FIG. 9. Therefore, in FIG. 9 and FIG. 10, the stress or mechanical strength of the membrane differs somewhat. To increase the mechanical strength at the membrane center, the structure of FIG. 9 is advantageous.

When the ratio of the width of the strut zones 6 to the length of a side of the pattern regions 7 is 1:4, a pattern can be formed in at least two sections of the four sections I to IV in addition to the arrangement shown in FIG. 9 or FIG. 10. For example, even if the strut zones 6 of the sections II and IV are arranged as shown in FIG. 11, it is possible to form the patterns in at least two sections of the sections I to IV for all blocks as shown in the following TABLE 3.

TABLE 3

|   | II | IV |   | III | IV |   | II | III |   | II | III | IV |   | II | III | IV |
|---|----|----|---|-----|----|---|----|-----|---|----|-----|----|---|----|-----|----|
| I |    | IV | I | III | IV | I |    | III | I |    | III | IV |   |    | III | IV |
| I | II |    | I | III |    | I | II | III | I | II | III |    |   | II | III |    |
| I | II | IV | I | III | IV | I | II | III | I | II | III | IV | II | III |    |
| I | II | IV | I |     | IV | I | II |     | I | II |     | IV |   | II |     | IV |

Figure 11:
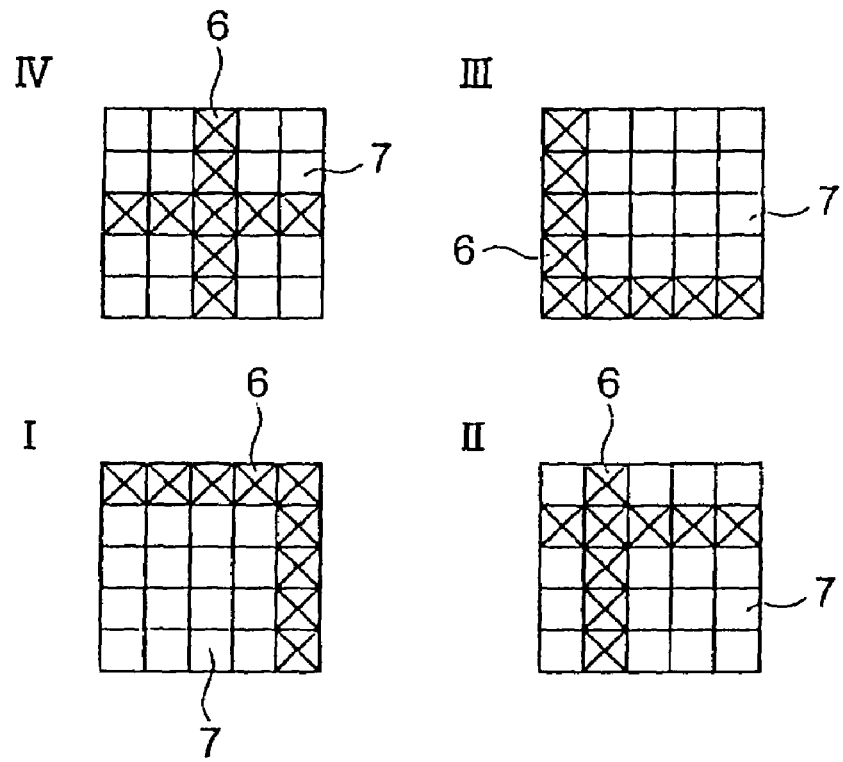
FIG. 11 is another example of patterns showing the arrangement of strut zones 6 of a stencil mask according to the first embodiment of the present invention.

However, in the example of FIG. 11, the arrangements of the strut zones 6 in the sections II and IV are not symmetrical about the center of the stencil mask (origin O of FIG. 5). For balancing the stress of the membrane, it is preferable to make the arrangements of the strut zones 6 symmetrical about the center of the stencil mask as shown in FIG. 9 or FIG. 10.

Figure 12:
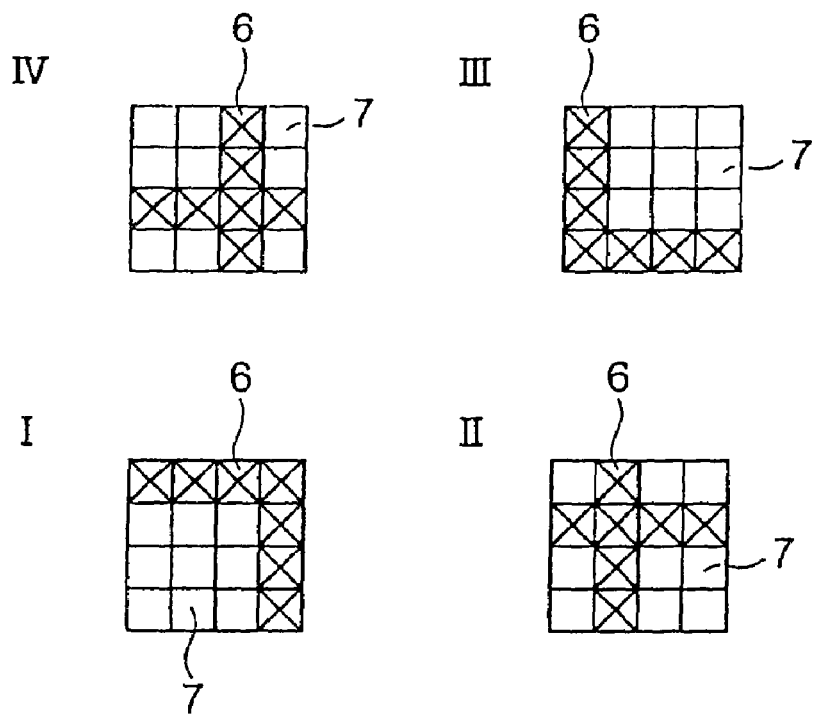
FIG. 12 is another example of patterns showing the arrangement of strut zones 6 of a stencil mask according to the first embodiment of the present invention.

FIG. 12 shows a case where the ratio of the width of the strut zones 6 to the length of a side of the pattern regions 7 is 1:3. TABLE 4 arranges the 4×4 block minimum unit patterns of FIG. 12 in a 4 row×4 column table and shows in which sections patterns can be formed for the individual blocks in the same way as the case of the above 1:4.

TABLE 4

|   | II | IV |   | III | IV |   | II | III | IV |   | II | III | IV |
|---|----|----|---|-----|----|---|----|-----|----|---|----|-----|----|
| I |    | IV | I | III | IV | I |    | III |    |   |    | III | IV |
| I | II |    | I | III |    | I | II | III |    |   | II | III |    |
| I | II | IV | I |     | IV | I | II |     |    |   | II |     | IV |

Figure 13:
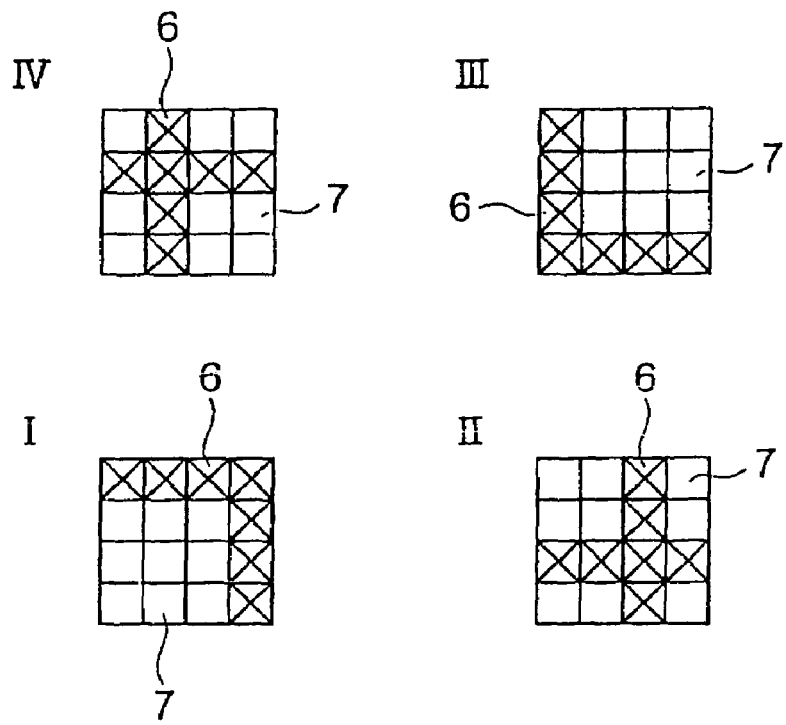
FIG. 13 is another example of patterns showing the arrangement of strut zones 6 of a stencil mask according to the first embodiment of the present invention.

In the example of FIG. 12 too, it is possible to form patterns in at least two sections of the sections I to IV for all blocks. Also, in the arrangement shown in FIG. 13 too, it is possible to form the patterns in at least two sections of the sections I to IV as shown in TABLE 5.

TABLE 5

|   | II | IV |   | II | III |   | III | IV |   | II | III | IV |
|---|----|----|---|----|-----|---|-----|----|---|----|-----|----|
| I | II |    | I | II | III | I | III |    |   | II | III |    |
| I |    | IV | I |    | III | I | III | IV |   |    | III | IV |
| I | II | IV | I | II |     | I |     | IV |   | II |     | IV |

Figure 14:
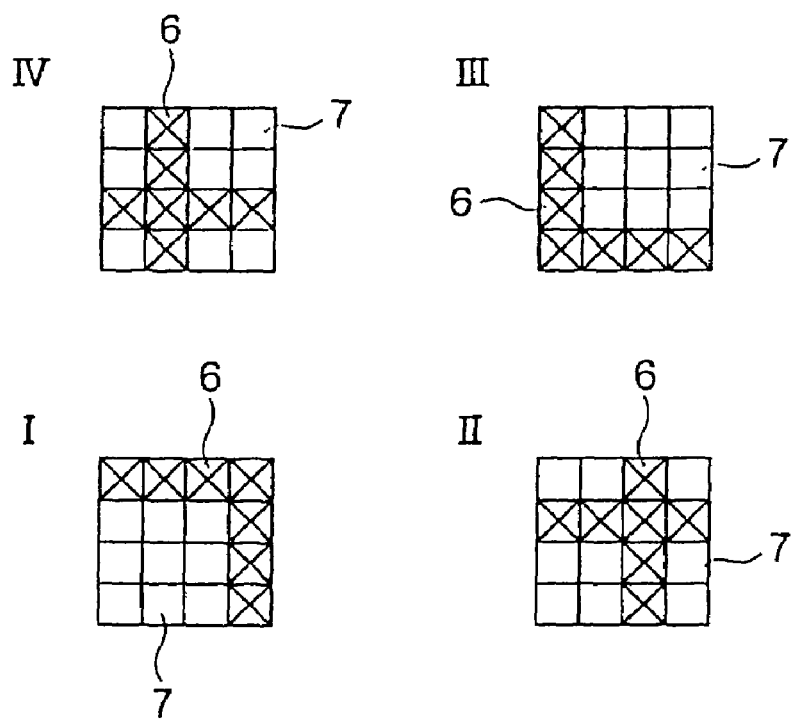
FIG. 14 is another example of patterns showing the arrangement of strut zones 6 of a stencil mask according to the first embodiment of the present invention.
Figure 17:
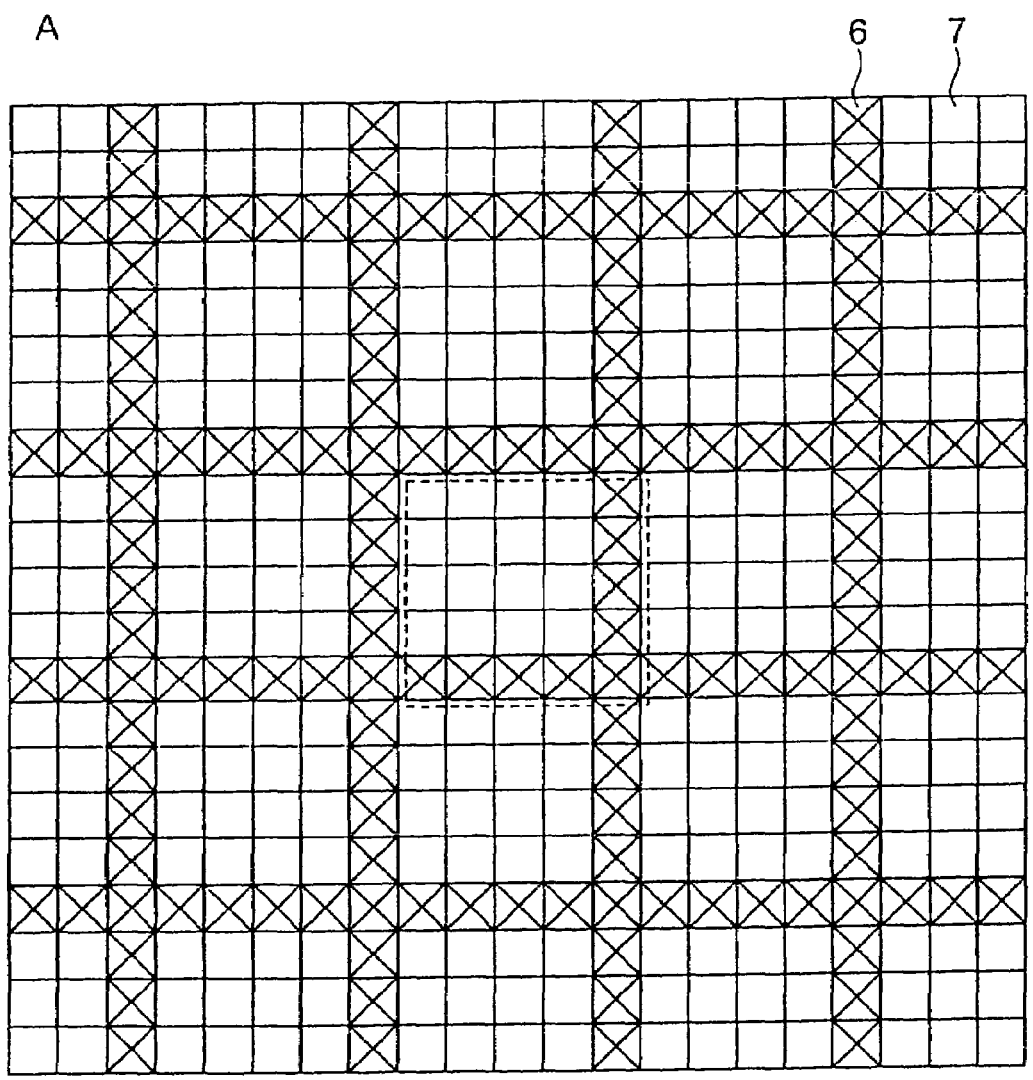
FIG. 17 is an example of patterns showing the arrangement of strut zones 6 of one stencil mask according to a second embodiment of the present invention.
Figure 18:
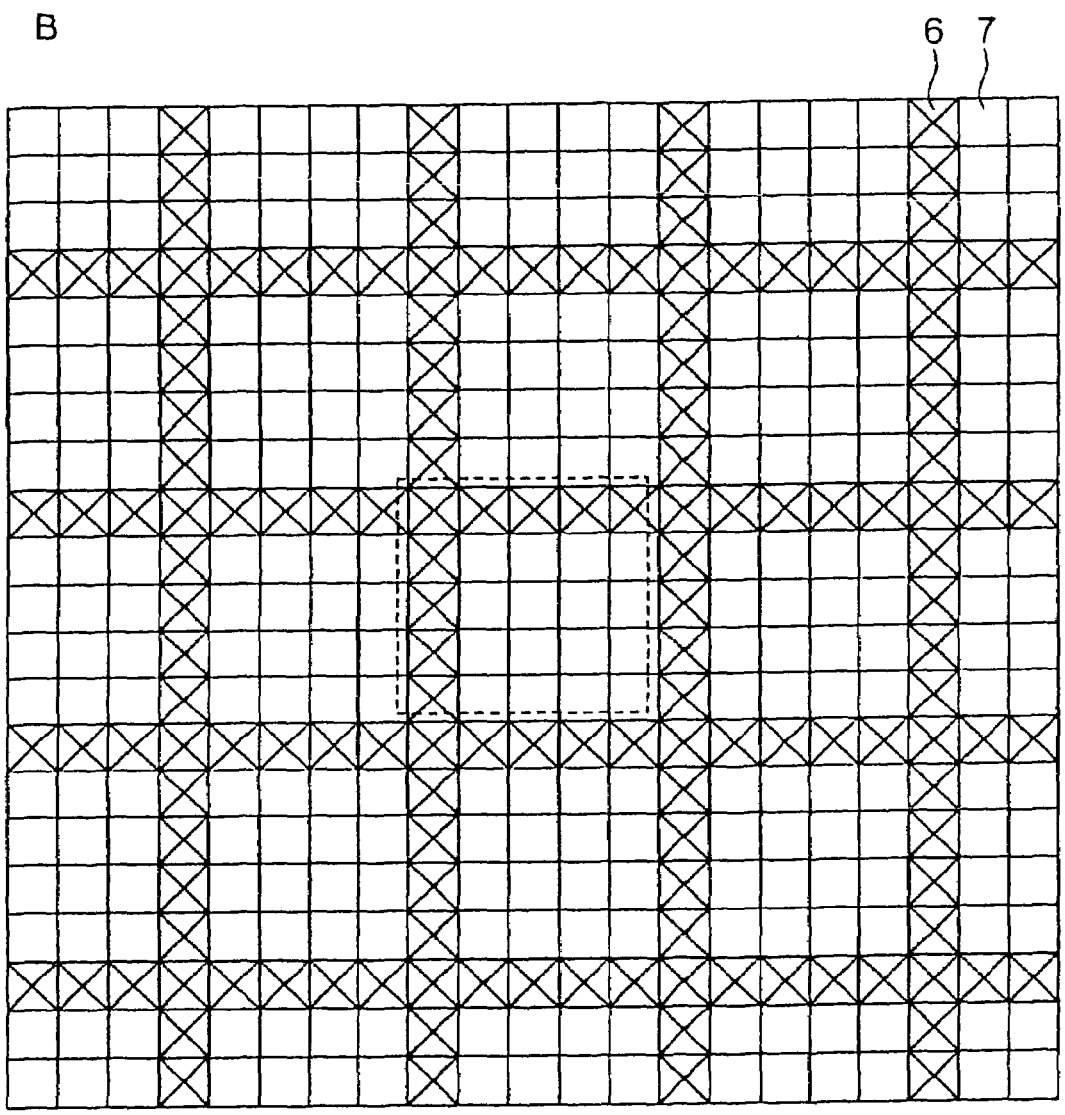
FIG. 18 is an example of patterns showing the arrangement of strut zones 6 of another stencil mask according to the second embodiment of the present invention.
Figure 19:
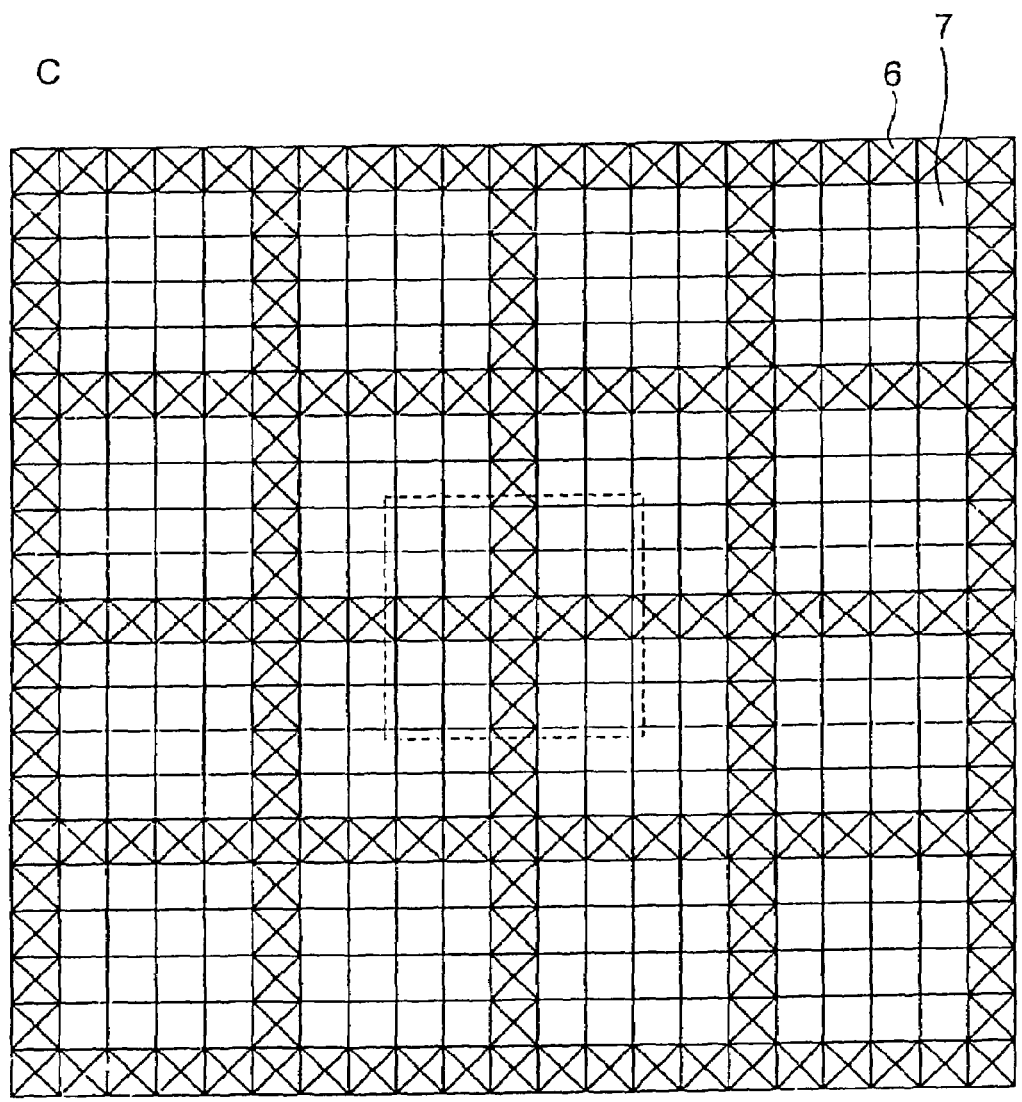
FIG. 19 is an example of patterns showing the arrangement of strut zones 6 of another stencil mask according to the second embodiment of the present invention.
Figure 20:
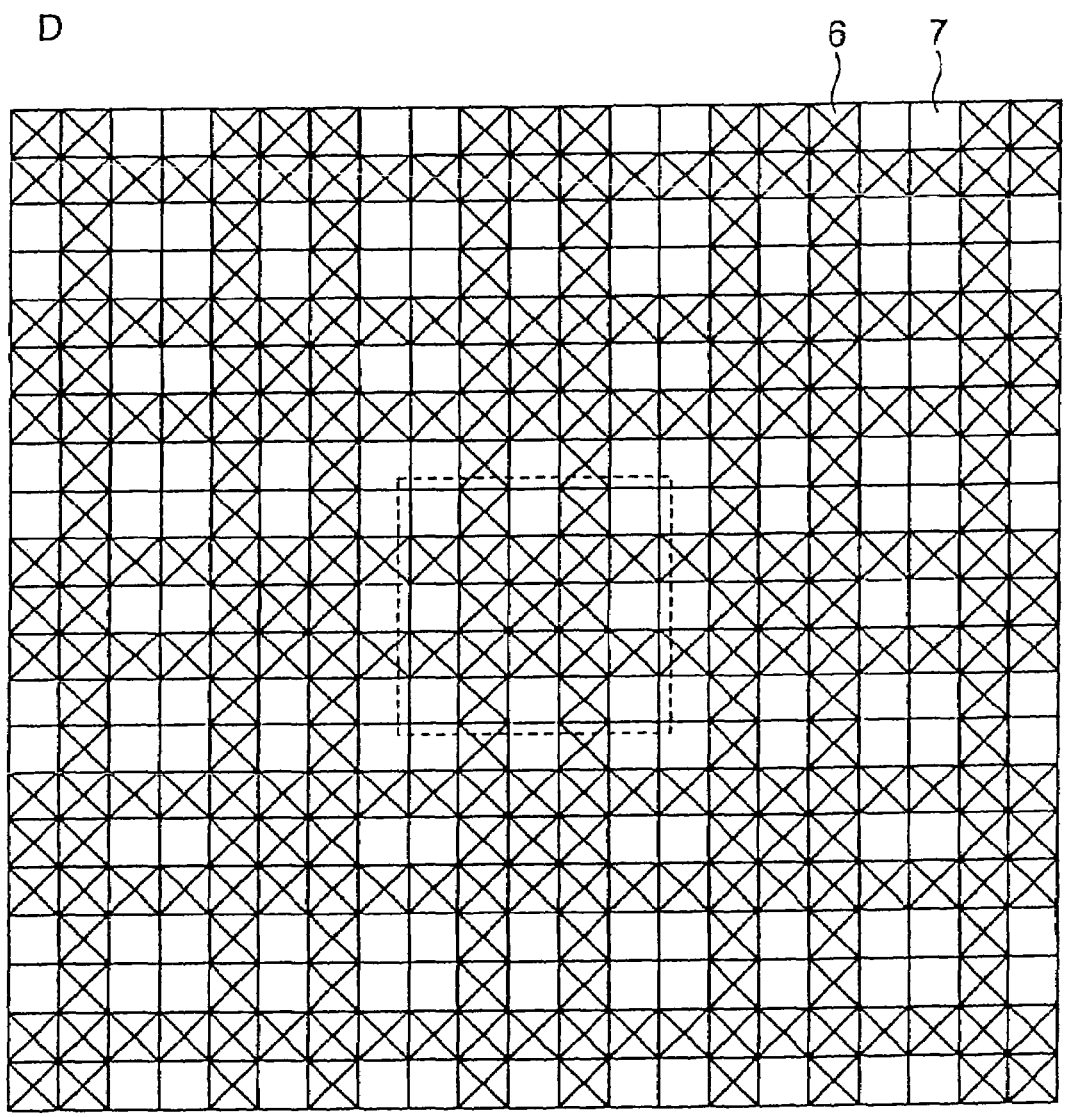
FIG. 20 is an example of patterns showing the arrangement of strut zones 6 of another stencil mask according to the second embodiment of the present invention.

Alternatively, in the arrangement shown in FIG. 14 too, it is possible to form the patterns in at least two sections of the sections I to IV as shown in TABLE 6.

TABLE 6

|   | II | IV |   | II | III |   | III | IV |   | II | III | IV |
|---|----|----|---|----|-----|---|-----|----|---|----|-----|----|
| I |    | IV | I |    | III | I | III | IV |   |    | III | IV |
| I | II |    | I | II | III | I | III |    |   | II | III |    |
| I | II | IV | I | II |     | I |     | IV |   | II |     | IV |

Even in the case where the ratio of the width of the strut zones 6 to the length of a side of the pattern region 7 is 1:3, it is also possible to rotate the patterns of FIGS. 10 to 12 by 90° about the origin O of FIG. 5 through the sections I to IV and make the strut zones 6 contact the x-axis and y-axis at the section II and the section IV.

If the ratio of the strut zones 6 to the length of a side of the pattern regions 7 is 1:2, it is not possible to form the patterns in at least two sections of the four sections I to IV. Therefore, the ratio of the strut zones 6 to the length of a side of the pattern regions 7 is made a whole multiple of 1:3 or more.

Figure 3:
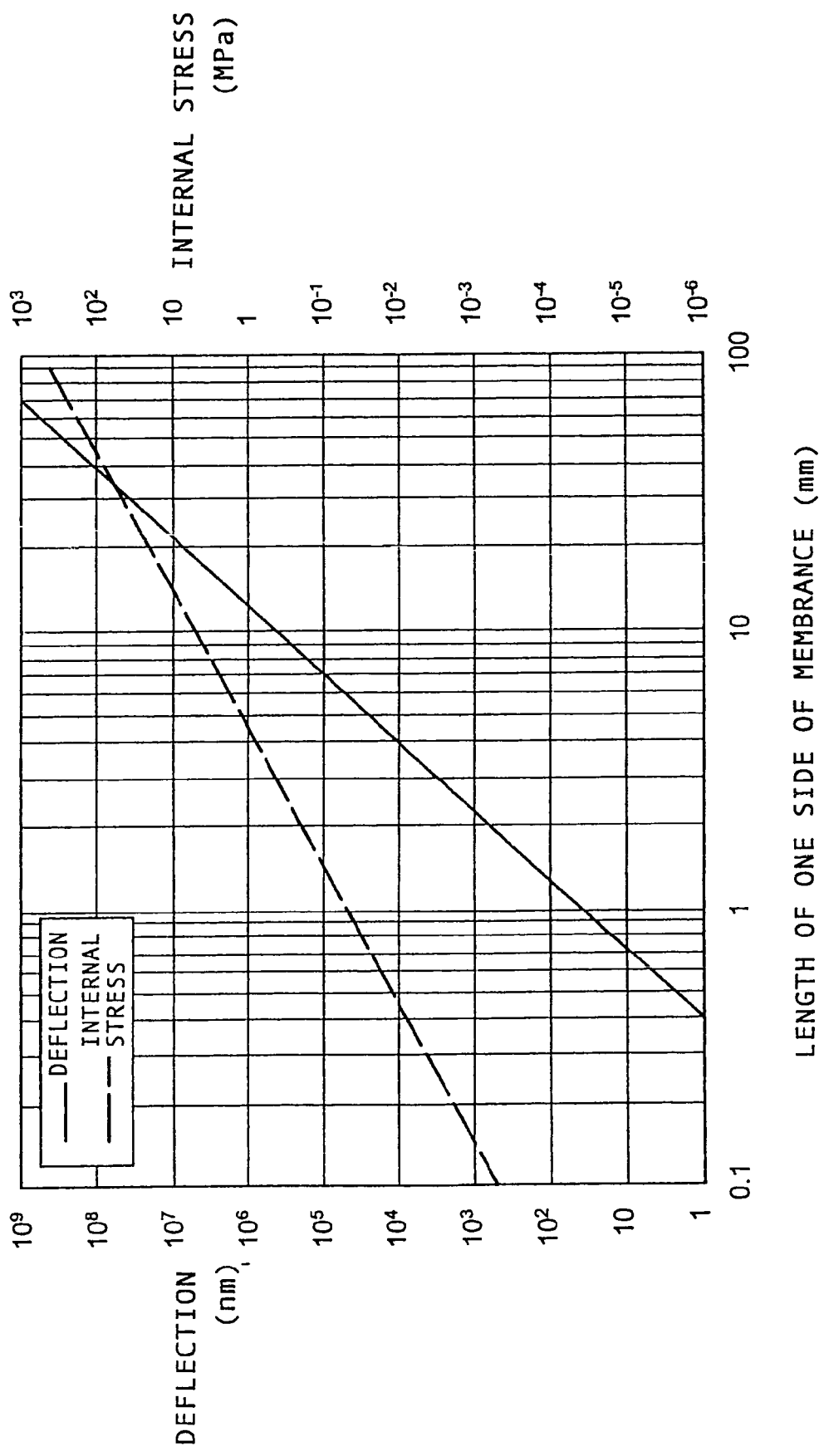
FIG. 3 is a graph showing dependency of deflection and internal stress of a membrane on membrane area.

When 1:5 or more, compared with 1:4, the possible arrangements of the strut zones 6 further increase. However, if the pattern regions 7 become larger, as shown in FIG. 3, the deflection or center stress of the membrane increases, so the effect due to provision of the struts decreases. On the other hand, when 1:3, the area of the pattern regions 7 becomes smaller. Therefore, the 1:4 configuration is especially preferable in practice.

Next, an example of the method of producing the stencil mask of the present embodiment will be explained.

First, as shown in FIG. 15A, the rear surface side of an SOI wafer 21 is for example formed with a silicon oxide film as a protective film 22 for dry etching. Here, the SOI wafer 21 is comprised of a silicon wafer 2 on one surface of which is formed a silicon layer via a silicon oxide film 10. The silicon layer is used as a membrane formation layer 3a.

Next, as shown in FIG. 15B, a resist 23 is formed on the protective film 22 in the patterns of the struts and frame. Further, the resist 23 is used as a mask to etch protective film 22.

Next, as shown in FIG. 15C, the protective film 22 is used as a mask to dry etch the silicon wafer 2 to form the struts 4 and frame 9 composed of silicon. This dry etching uses as an etching gas for example $SF_6$, $NF_3$, or another a fluorine-based gas. In the dry etching, the silicon oxide film 10 is used as an etching stopper layer.

When using for example an 8-inch wafer as the SOI wafer 21, the thickness of the silicon wafer 2 is 725 μm. Therefore, if not providing the protective film 22 and using the resist 23 as a mask to dry etch the silicon wafer 2, the resist 23 would be consumed before etching of the amount of the thickness of the silicon wafer 2 were completed and it would become difficult to form the struts 4 and frame 9. Therefore, the protective film 22 is provided.

Next, as shown in FIG. 15D, the struts 4 and frame 9 are used as a mask to etch the silicon oxide film 10. The etching is for example wet etching by using for example hydrofluoric acid. Due to the etching, the protective film 22 is also removed.

Next, as shown in FIG. 15E, the surface of the membrane formation layer 3a at the strut 4 side is coated with a resist 24. Since the resist-coated surface has relief due to the struts 4, the resist cannot be coated by usual spin coating. Methods able to coat a resist on such a relief surface are disclosed in for example Japanese Patent No. 3084339, Japanese Unexamined Patent Publication (Kokai) No. 10-321493, Japanese Unexamined Patent Publication (Kokai) No. 8-306614, Japanese Unexamined Patent Publication (Kokai) No. 11-329938, or The 61st Extended Abstracts; The Japan Society of Applied Physics (2000) No. 2, p. 593, 4a-X-1. By using for example these methods, the surface where the struts 4 are formed can be coated uniformly by the resist 24.

Next, as shown in FIG. 15F, patterns for forming the holes are transferred to the resist 24. The resist 24 can be patterned by the usual electron beam lithography.

Next, as shown in FIG. 15G, the resist 24 is used as a mask to dry etch the membrane formation layer 3a to form the holes 8 of the stencil mask. This dry etching uses as an etching gas for example $SF_6$, $NF_3$, or another fluorine-based gas. After this, as shown in FIG. 6, the resist 24 is removed to obtain the stencil mask of the present embodiment.

According to the stencil mask of the present embodiment, as shown in FIG. 16, alignment marks 25 can be provided at any location of the struts 4. When using the stencil mask for LEEPL, it is possible to use the plurality of alignment marks provided on the struts 4 for alignment so as to improve the precision of superposition of multiple exposure and the precision of interlayer alignment of multilevel interconnections due to alignment.

Second Embodiment

While the stencil mask of the first embodiment has different complementary patterns formed in the four sections I to IV within the same mask, it is also possible to form these complementary patterns on different stencil masks. The second embodiment shows an example of forming complementary patterns on a plurality of stencil masks and transferring the patterns by multiple exposure.

In the present embodiment, at least three stencil masks are used to transfer patterns of interconnections on a resist. When using complementary stencil masks having no struts, desired patterns of interconnections including donut-shaped patterns can be transferred by two masks. As opposed to this, since the stencil mask of the present embodiment has struts for reinforcement, patterns of interconnections cannot be formed at the locations of struts. Therefore, at least three complementary masks are required.

Although the shapes or patterns of the struts are not particularly restricted, for improving the mechanical strength, the frame around the membrane and the struts are connected. In the same manner, the struts are connected with each other. Usually, when arranging the struts in a lattice pattern, the process of dividing the patterns becomes easy.

Next, an example of arrangement of the struts formed in a plurality of complementary stencil masks of the present embodiment will be explained. In the present embodiment, four stencil masks A to D are used. FIGS. 17 to 20 extract regions to be exposed multiply from the membranes of the stencil masks A to D and show them supplementarily with grids of 21×21 blocks. In the same manner as FIG. 9 of the first embodiment, blank blocks in the stencil masks indicate pattern regions 7, while the X'ed blocks indicate the strut zones 6.

TABLE 7 further extracts the 5×5 blocks to be exposed multiply (patterns in regions surrounded by broken lines) from the patterns of FIG. 17 to FIG. 20, arranges them in a 5 row×5 column table, and shows which stencil masks the patterns can be formed in for each block:

TABLE 7

| | | | | | | | | | | | | | | |
|---|---|---|---|---|---|---|---|---|---|---|---|---|---|---|
| A | | C | D | A | | C | A | | D | A | | C | | C | D |
| A | | C | | A | B | C | A | B | | A | B | C | B | C | |
| A | | | D | A | B | | A | B | | A | B | | | B | D |
| A | | C | | A | B | C | A | B | | A | B | C | B | C | |
| | | C | D | | B | C | | B | D | | B | C | B | C | D |

As shown in TABLE 7, it is possible to form patterns in at least two stencil masks of the four stencil masks for all blocks. Therefore, for example, even if there are topologically donut-shaped patterns, it is possible to transfer the patterns by dividing the patterns and forming different holes in two stencil masks to be exposed multiply. Also, it is possible to form patterns by at least two of the four stencil masks even for blocks other than those surrounded by broken lines among the patterns of FIG. 17 to FIG. 20.

As explained above, in the present embodiment, the membranes of the four complementary stencil masks are reinforced by the struts. Due to this, the bending of the membranes is decreased and it becomes possible to transfer the patterns of interconnections precisely.

The struts of the stencil masks of the present embodiment can be formed, for example, in the same manner as the first embodiment, by dry etching a silicon wafer. Alternatively, it is also possible to form the struts on the surface of the membranes at the opposite side to the frames as follows. In this case, the material of the struts is not restricted to silicon. The height of the struts can also be freely changed if necessary.

Figure 21:
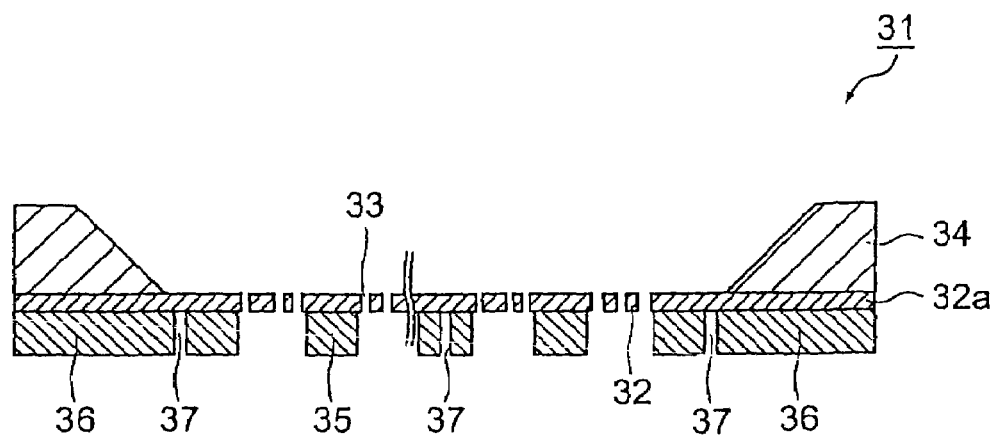
FIG. 21 is a cross-sectional view of a stencil mask according to the second embodiment of the present invention.

FIG. 21 is a sectional view of a stencil mask of the present embodiment. As shown in FIG. 21, the stencil mask 31 has at the center part a membrane 32. The membrane 32 is formed with holes 33 corresponding to the patterns. The membrane 32 is part of a membrane formation layer 32a. A frame 34 for supporting the membrane 32 is formed around the membrane 32.

The surface of the membrane 32 at the opposite surface of the frame 34 are formed with struts 35 at predetermined intervals. The struts 35 are made from the same material as a supporting layer 36. The struts 35 and supporting layer 36 are formed with alignment marks 37 at any locations. The stencil mask 31 of FIG. 21 is struck with an electron beam at the surface at the frame 34 side.

Figure 22:
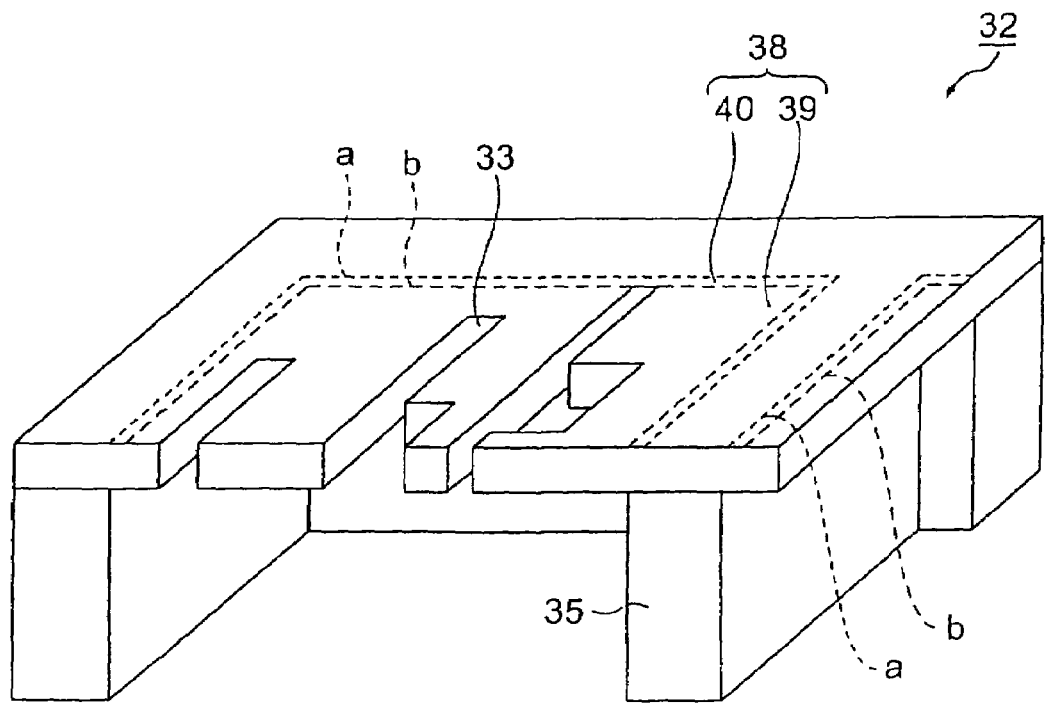
FIG. 22 is an enlarged cross-sectional view of a part of FIG. 21.

FIG. 22 is an enlarged perspective view of one of the membrane divided regions and the struts 35 around it in the stencil mask of FIG. 21. As shown in FIG. 22, the membrane 32 is divided into membrane divided regions 38 by the struts 35. The inside part of the broken lines a are the membrane divided regions 38.

The stencil mask of the present embodiment, in the same manner as the stencil mask of the first embodiment, is also provided with pattern regions 39 (part inside broken lines b) and skirts 40 around them (parts between the broken lines a and broken lines b) in the membrane divided regions 38. The holes 33 are in principle formed in the pattern regions 39.

Figure 23:
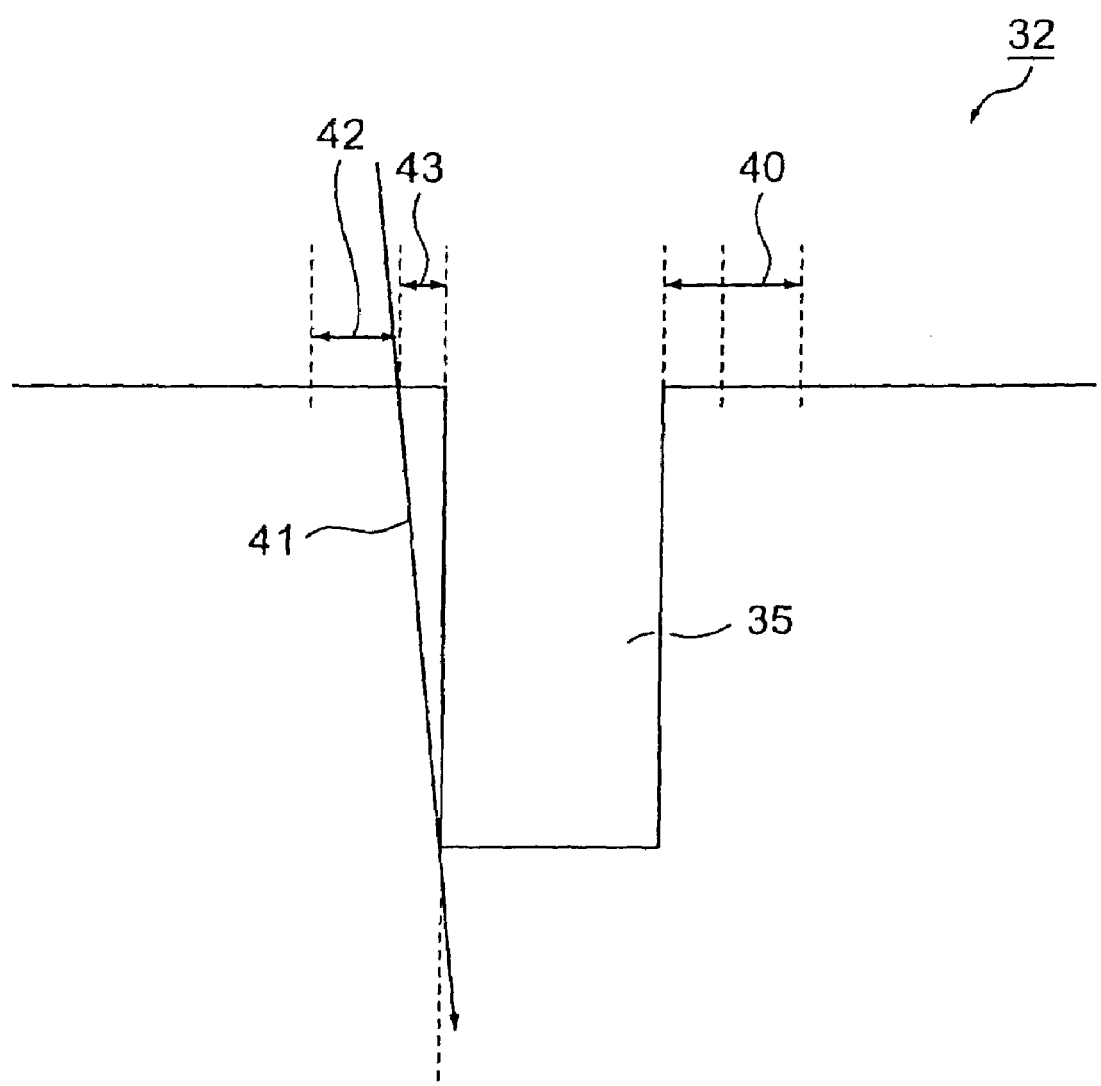
FIG. 23 is an enlarged cross-sectional view of the struts 35 of FIG. 21.

FIG. 23 is an enlarged sectional view near the struts 35 of FIG. 22. When electron beam 41 strikes the stencil mask obliquely, the electron beam 41 is never blocked by the struts 35 before striking the membrane 32. However, the electron beam 41 passing through the holes of the membrane 32 are sometimes blocked by the struts 35.

Therefore, it is also possible to further provide margins 42 and blanks 43 in the skirts 40 in the same manner as the stencil mask of the first embodiment. However, the struts 35 of the stencil mask of the present embodiment are usually low enough compared with the struts of the stencil mask of the first embodiment, so all of the skirts 40 can be utilized as the margins 42.

Figure 24A:
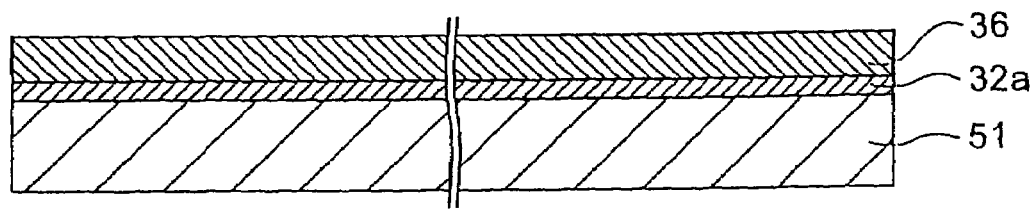
FIGS. 24A to 24F are cross-sectional views of production steps of a method of producing a stencil mask according to the second embodiment of the present invention.

Next, a method of producing the stencil mask 31 of the present embodiment will be explained. First, as shown in FIG. 24A, for example a silicon layer is formed as the membrane formation layer 32a on a silicon wafer 51. Alternatively, although not shown, in the same manner as the first embodiment, it is also possible to use an SOI wafer and use a silicon oxide film between a silicon wafer and silicon layer as an etching stopper layer. As the silicon layer of the membrane formation layer 32a, not low strength polycrystalline silicon, but single crystal silicon is used.

As the membrane material, molybdenum, diamond, diamond like carbon (DLC), silicon oxide, etc. can be used in addition to silicon. A multilayer film of, for example, tungsten nitride/tungsten/tungsten nitride can also be used as the membrane formation layer. If the membrane material is electroconductive, charge-up of the stencil mask during the LEEPL exposure can be prevented. The thickness of the membrane formation layer is suitably determined considering the material strength, the aspect ratio of the holes 33 (see FIG. 21), and so on.

Further, the membrane formation layer 32a is formed with a supporting layer 36. The thickness of the supporting layer 36 is set to about several times to several tens of times the thickness of the membrane formation layer 32a and is suitably set depending on the material of the supporting layer 36 or the width or interval between the struts 35 (see FIG. 21). As the material of the supporting layer 36, for example silicon carbide, silicon nitride, silicon oxide, diamond, DLC, etc. can be used. The supporting layer 36 made of these materials can be formed by for example chemical vapor deposition (CVD).

Figure 24B:
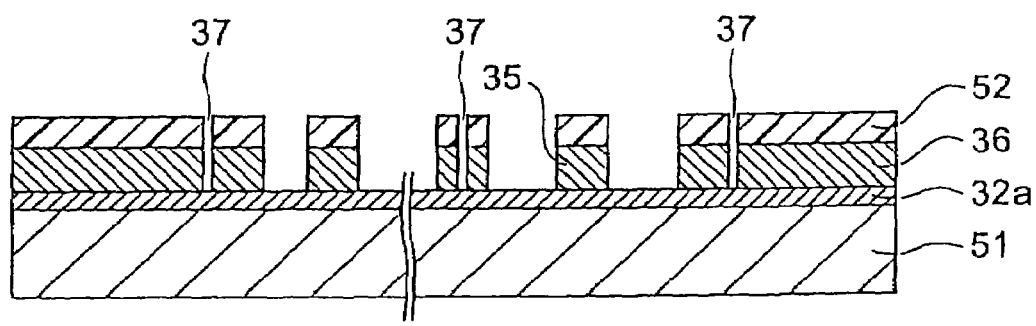

Next, as shown in FIG. 24B, the supporting layer 36 is formed with a resist 52 in patterns of the struts and frame (see FIG. 21). Next, the resist 52 is used as a mask to etch the supporting layer 36 to form the struts 35. The space between the struts 35 is made for example 1 μm or more. Here, parts of the struts 35 and parts of the supporting layer 36 around the membrane 32 (see FIG. 21) are formed with grooves as alignment marks 37.

Figure 24C:
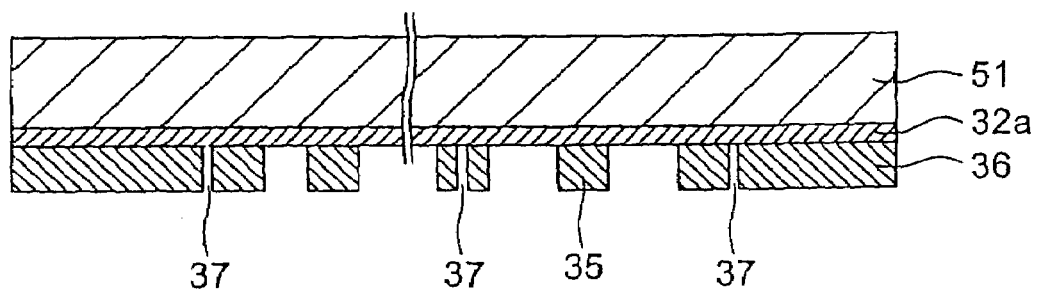

After this, as shown in FIG. 24C, the resist 52 is removed.

Figure 24D:
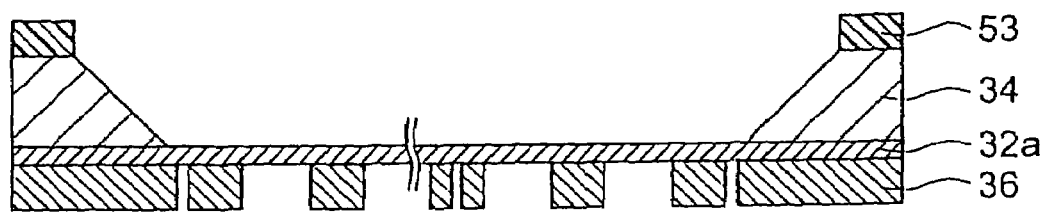

Next, as shown in FIG. 24D, the surface of the silicon wafer 51 at the apposite side of the membrane formation layer 32a is formed with a resist 53 in the pattern of the frame. Although not shown, before forming the resist 53 on the surface of the silicon wafer 51, if necessary, it is also possible to form a protective film in the same manner as the protective film 22 of the first embodiment (see FIG. 15A). As the protective film, for example a silicon oxide film or silicon nitride film can be used.

The resist 53 (or the protective film if a protective film is formed) is used as a mask to etch the silicon wafer 51 to expose the membrane formation layer 32a. Due to this, the frame 34 is formed. This etching can be performed by wet etching using a solution including for example potassium hydroxide (KOH) or tetramethylammonium hydroxide (TMAH). Alternatively, it is also possible to perform dry etching in the same manner as the first embodiment to process the cross-section of the frame 34 substantially perpendicularly to the membrane. After the etching, the resist 53 or the protective film is removed.

Figure 24E:
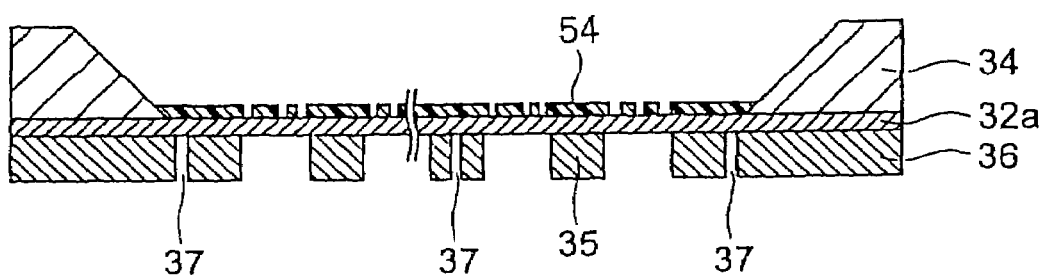

Next, as shown in FIG. 24E, the surface of the membrane formation layer 32a at the frame 34 side is coated with a resist 54, then a micropattern formation apparatus such as an electron beam exposure apparatus is used to patern the resist 54. If a relatively large area membrane is formed at the center of the wafer, the resist 54 can be coated by spin coating. However, when the resist 54 cannot be coated uniformly by spin coating due to the influence of the frame 34, various types of coating methods given as coating methods of the resist 24 (see FIG. 15E) of the first embodiment can be used.

According to the present embodiment, since at least three stencil masks are used for transferring patterns, alignment must be performed precisely. Due to formation of the alignment marks 37 on each stencil mask, the patterns can be superpositioned using the alignment marks 37 as reference. Due to use of the alignment marks 37, it is also possible to improve the interlayer alignment precision of multilayer interconnections.

Since the acceleration voltage of the electron beam exposure apparatus used in the step of FIG. 24E is a high 50 to 100 kV, the electron beam passes through the resist 54 and the membrane formation layer 32a. Therefore, the alignment marks 37 can be detected from the resist 54 side.

Figure 24F:
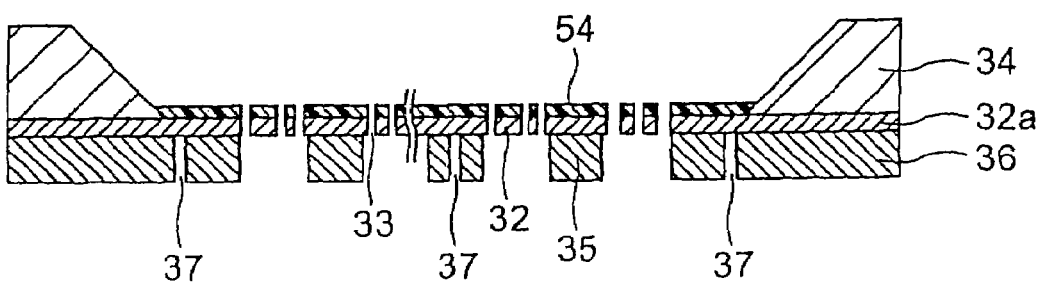

Next, as shown in FIG. 24F, the resist 54 is used as a mask to dry etch the membrane formation layer 32a. Due to this, the membrane 32 having holes 33 is formed. After this, the resist 54 is removed, whereby the stencil mask 31 shown in FIG. 21 is obtained.

By forming at least three stencil masks different from each other in arrangement of the struts by the above method, complementary stencil masks can be obtained.

Third Embodiment

A modification of the stencil mask shown in the second embodiment having struts at the surface of the membrane at the opposite side of the frame will be explained.

Figure 25A:
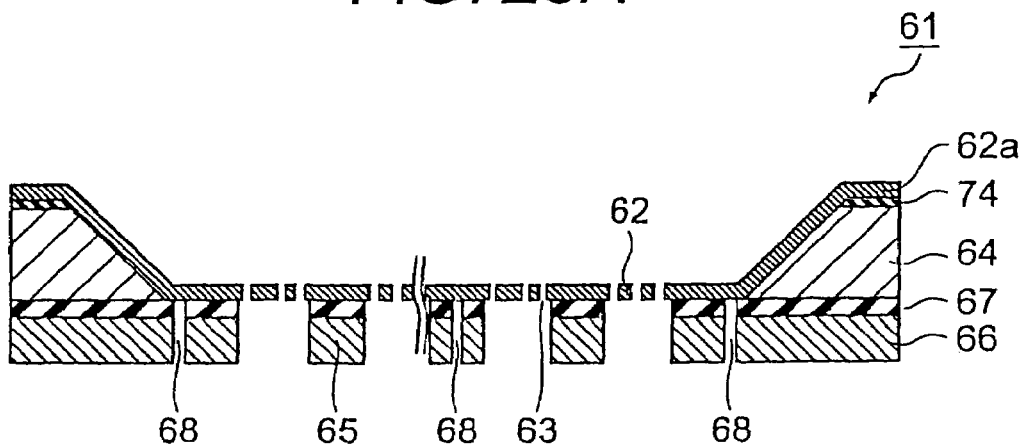
FIG. 25A is a cross-sectional view of a stencil mask according to a third embodiment of the present invention and FIGS. 25B to 25I are cross-sectional views of production steps of a method of producing a stencil mask according to the third embodiment of the present invention.

FIG. 25A is a sectional view of a stencil mask of the present embodiment. As shown in FIG. 25A, the stencil mask 61 has at the center part a membrane 62. The membrane 62 is formed with holes 63 corresponding to the patterns. The membrane 62 is part of a membrane formation layer 62a.

The membrane 62 is formed around it with a frame 64 for supporting the membrane 62. The surface of the membrane at the opposite side of the frame 64 is formed with struts 65 at predetermined intervals. The struts 65 are formed from the same material as a supporting layer 66. A silicon oxide film 67 is formed between the membrane 62 and the struts 65 and between the struts 65 and the supporting layer 66. Alignment marks 68 are formed at any locations of the struts 65 and the supporting layer 66. The electron beam strikes the stencil mask 61 of FIG. 25A at the surface at the membrane 62 side.

Figure 25B:
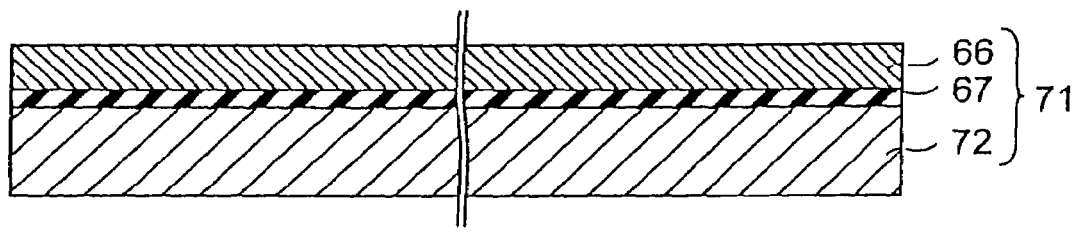

Next, a method of producing the above stencil mask of the present embodiment will be explained. An SOI wafer 71 shown in FIG. 25B is used as the material of the mask. The SOI wafer 71 comprises a silicon wafer 72 on one surface of which is provided a silicon layer forming the supporting layer 66 of FIG. 25A via a silicon oxide film 67.

Figure 25C:
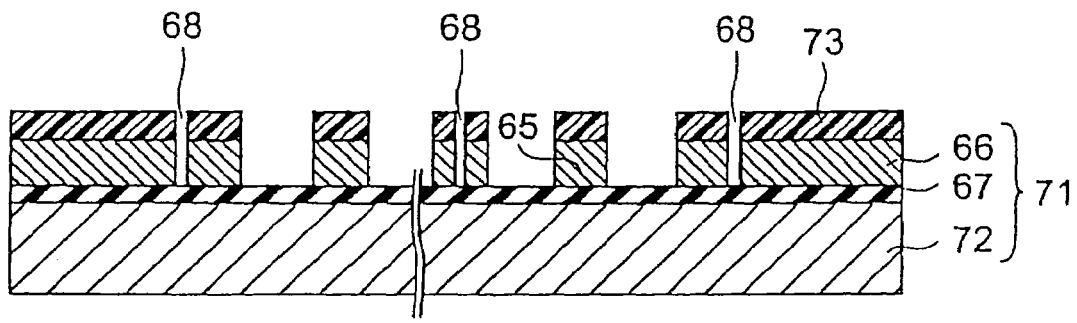

Next, as shown in FIG. 25C, a resist 73 is formed on the silicon layer (supporting layer 66) of the SOI wafer 71 in the patterns of the struts. Since patterning of the resist 73 for forming the struts does not require a high resolution such as patterning of a resist for forming the holes 63 (see FIG. 25A), it can be performed by photolithography of for example a same scale proximity projection system.

The resist 73 is used as a mask to etch the supporting layer 66 to form the struts 65. In this step, part of the struts 65 or the supporting layer 66 is formed with alignment marks 68 in the same manner as the second embodiment. When patterning the resist 73 by photolithography of a same scale proximity projection system, a wide angle field of 50 mm or more can be obtained. Therefore, patterns corresponding to the plurality of alignment marks 68 can be transferred in one shot of exposure so that fluctuation of the distance between the alignment marks 68 can be prevented. Due to this, the alignment precision of patterns among a plurality of complementary stencil masks is improved.

Figure 25D:
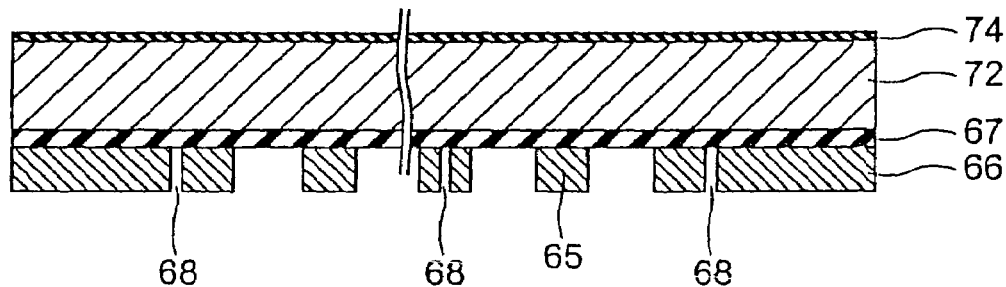

Next, as shown in FIG. 25D, the resist 73 is removed, then the surface of the silicon wafer 72 at the opposite side of the supporting layer 66 is formed with a protective film 74. As the protective film 74, a silicon oxide film etc. can be used in the same manner as the first embodiment.

Figure 25E:
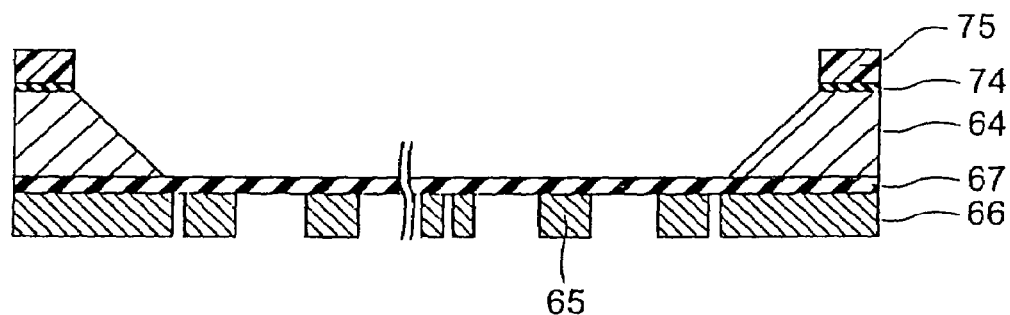

Next, as shown in FIG. 25E, the protective film 74 is formed with a resist 75 in the pattern of the frame.

The resist 75 is used as a mask to etch the silicon wafer 72 to expose the silicon oxide film 67. Due to this, the frame 64 is formed. This etching is performed by wet etching or dry etching in the same manner as the second embodiment. After this, the resist 75 is removed.

Figure 25F:
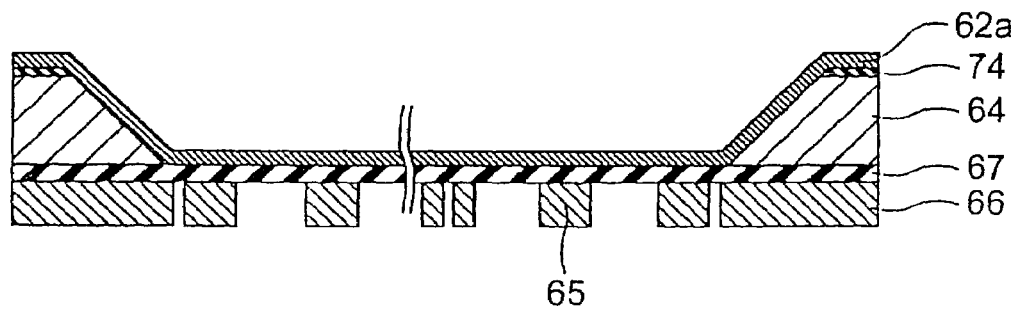

Next, as shown in FIG. 25F, the silicon oxide film 67 is formed with the membrane formation layer 62a. At this time, the surface of the frame 64 is also formed with a membrane formation layer 62a in some cases, but this is not particularly a problem. For forming the membrane formation layer 62a, almost all of the film-formation methods employed generally in a production process of a semiconductor device, specifically CVD, sputtering, deposition, plating, etc. can be used.

The material of the membrane formation layer 62a may be one similar to the second embodiment. If the membrane formation layer 62a is electroconductive, charge-up of the stencil mask during the LEEPL exposure is prevented. When forming a metal layer as the membrane formation layer 62a, a layer serving as a mask for etching the metal layer (protective film) may be laminated on the metal layer.

Figure 25G:
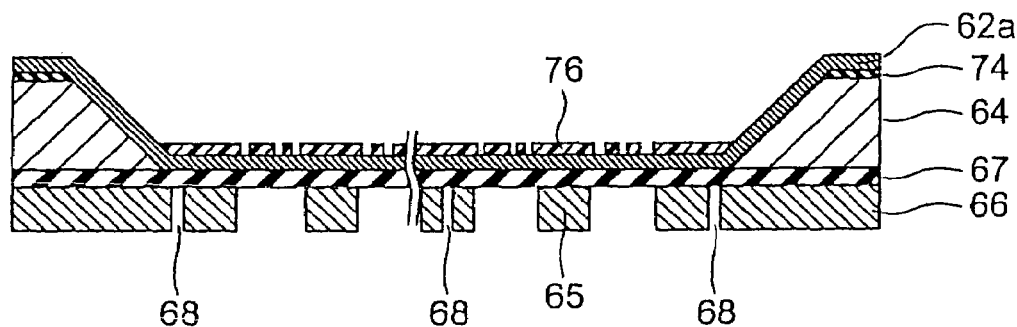

Next, as shown in FIG. 25G, the membrane formation layer 62a is coated with a resist 76, then a micropatern formation apparatus such as an electron beam exposure apparatus is used to pattern the resist. In the same manner as the second embodiment, if the resist 76 cannot be coated by spin coating, various coating methods listed in the first embodiment are used. Also, when patterning the resist, in the same manner as the second embodiment, alignment is performed by using the alignment marks 68 as references. Due to this, the patterns formed in a plurality of complementary stencil masks can be superpositioned precisely. Also, the alignment precision between layers of multilayer interconnections is improved.

Figure 25H:
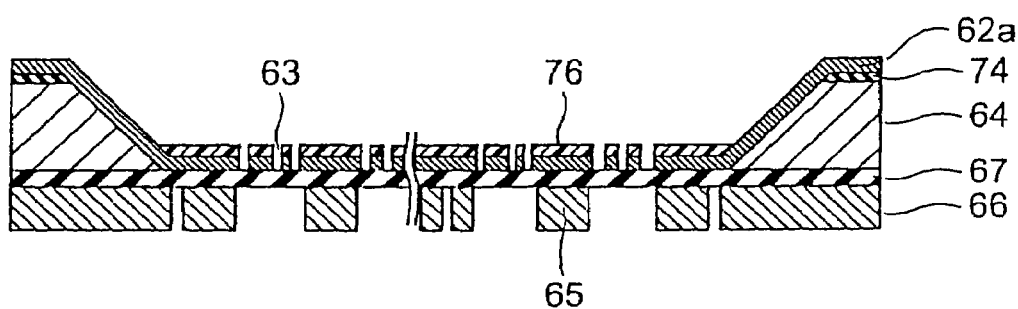
Figure 25I:
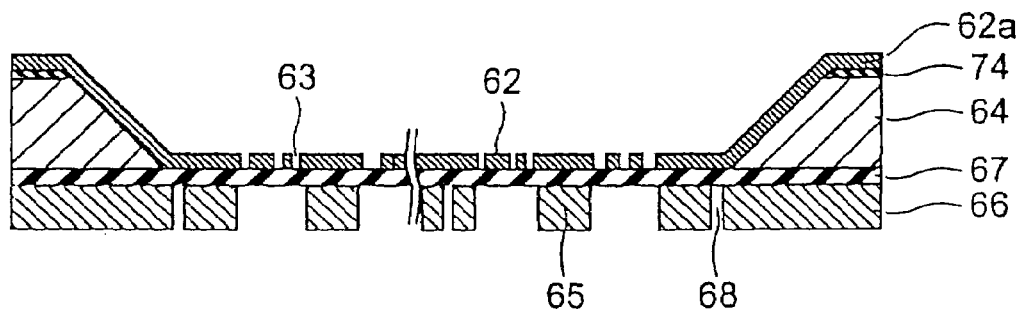

Next, as shown in FIG. 25H, the resist 76 is used as a mask to dry etch the membrane formation layer 62a. Due to this, the holes 63 are formed. After the etching, as shown in FIG. 25I, the resist 76 is removed.

After this, the struts 65 are used as a mask to etch the silicon oxide film 67 to expose the parts of the membrane 62 where the struts 65 are not formed, whereby the stencil mask 61 shown in FIG. 25A is obtained.

By forming at least three stencil masks different from each other in arrangement of the struts by the above method, complementary stencil masks can be obtained.

The embodiments of the mask, the method of producing a mask, and the method of producing a semiconductor device of the present invention are not limited to the above explanation. For example, in the first embodiment, the holes 8 of the membrane 3 can be formed by dry etching from the surface of the membrane 8 at the side opposite to the frame 9. Also, in the first embodiment, the shape of the parts surrounded by the struts (the membrane divided region) need not be square and may also be rectangular.

It is also possible to use a layer other than the silicon layer as the membrane formation layer of the stencil mask in the first embodiment. By using an electroconductive layer as the membrane formation layer, charge-up can be prevented during the LEEPL exposure. Also, for the purpose of preventing the charge-up, an electroconductive layer can be provided on the membrane of the stencil mask of the first and second embodiment.

It is also possible to use the stencil mask of the above embodiments for lithography other than electron beam lithography, such as ion beam lithography. Alternatively, the stencil mask of the present embodiment can be used for a production process of semiconductor devices other than lithography using a charged particle beam such as ion implantation.

In addition, various modifications can be made within the scope of the present invention.

According to the mask of the present invention, a drop in the precision of pattern position due to the influence of the internal stress of the membrane can be prevented and it becomes possible to precisely align patterns including complementary patterns.

According to the method of producing a mask of the present invention, struts enabling a reduction in thickness of the membrane can be formed on a stencil mask.

According to the method of producing a semiconductor device of the present invention, it is possible to prevent displacement and distortion of patterns and form micropatterns precisely.

LIST OF REFERENCES 1, 31, 61, 101 ... stencil mask
2, 51, 72 ... silicon wafer
3, 32, 62, 102 ... membrane
3a, 32a, 62a, 102a ... membrane formation layer
4, 35, 65 ... strut
5, 38 ... membrane divided region
6 ... strut zone
7, 39 ... pattern region
8, 33, 63, 103 ... hole
9, 34, 64, 104 ... frame
10, 67 ... silicon oxide film
11, 40 ... skirt
12, 42 ... margin
13, 43 ... blank
14, 41, 107 ... electron beam
21, 71 ... SOI wafer
22, 74 ... protective film
23, 24, 52 to 54, 73, 75, 76, 106 ... resist
25, 37, 68 ... alignment ,mark
36, 66 ... supporting layer
105 ... wafer

The invention claimed is:

1. A mask comprising:
    a supporting layer having struts; a membrane formation layer; and a support frame,
    wherein grooves within said supporting layer separate one of the struts from another of the struts, said struts dividing said membrane formation layer into membrane divided regions,
    wherein an opening through said support frame exposes said membrane divided regions,
    wherein holes through said membrane divided region extend from some of said grooves to said opening, others of said grooves being alignment marks.

2. The mask according to claim 1, wherein said holes correspond to patterns.

3. The mask according to claim 1, wherein said membrane formation layer is a metal.

4. The mask according to claim 1, wherein said membrane formation layer is an electroconductive layer.

5. The mask according to claim 1, wherein a silicon oxide film is between said supporting layer and said membrane formation layer.

6. The mask according to claim 1, wherein said supporting layer and said struts are of the same material.

* * * * *